(12) United States Patent
Aswani et al.

(10) Patent No.: US 10,332,689 B2
(45) Date of Patent: Jun. 25, 2019

(54) SOLAR CELL AND PROCESS FOR PRODUCING THE SAME

(71) Applicant: ECOLE POLYTECHNIQUE FEDERALE DE LAUSANNE (EPFL), Lausanne (CH)

(72) Inventors: Yella Aswani, Mumbai (IN); Mohammad Khaja Nazeeruddin, Ecublens (CH); Michael Graetzel, St-Sulpice (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 209 days.

(21) Appl. No.: 14/966,551

(22) PCT Filed: Jun. 27, 2014

(86) PCT No.: PCT/IB2014/062680
§ 371 (c)(1),
(2) Date: Dec. 11, 2015

(87) PCT Pub. No.: WO2015/001459
PCT Pub. Date: Jan. 8, 2015

(65) Prior Publication Data
US 2016/0141112 A1 May 19, 2016

(30) Foreign Application Priority Data
Jul. 1, 2013 (EP) .................... 13174589

(51) Int. Cl.
*H01G 9/00* (2006.01)
*H01G 9/20* (2006.01)
(Continued)

(52) U.S. Cl.
CPC ......... *H01G 9/2027* (2013.01); *H01G 9/0029* (2013.01); *H01L 51/0003* (2013.01);
(Continued)

(58) Field of Classification Search
None
See application file for complete search history.

(56) References Cited

U.S. PATENT DOCUMENTS

2010/0084008 A1    4/2010   Kim et al.
2015/0024539 A1    1/2015   Brohan et al.

FOREIGN PATENT DOCUMENTS

EP         2538452 A2    12/2012
JP    2012204275 A    10/2012
(Continued)

OTHER PUBLICATIONS

Liao et al., Wet chemical route to hierarchical TiO2 nanodendrite/nnaoparticle anodes for dye-sensitized solar cells; J Mater Chem, 2011, 21, 9255 (Year: 2011).*
(Continued)

*Primary Examiner* — Shannon M Gardner
(74) *Attorney, Agent, or Firm* — Taft Stettinius & Hollister LLP

(57) ABSTRACT

The present invention relates to photoanodes, solar cells and methods and processes for producing the same. In some embodiments, the solar cells of the invention can do without a sintered nanoporous scaffold layer, making it possible to produce the solar cells in low-temperature procedures. In some embodiments, the invention encompasses organic-inorganic perovskite sensitizers, deposited on a smooth metal oxide layer. In some embodiments, the organic-inorganic perovskite sensitizers are deposited in a two-step sequential process.

14 Claims, 8 Drawing Sheets

(51) Int. Cl.
H01L 51/00 (2006.01)
H01L 51/42 (2006.01)

(52) U.S. Cl.
CPC ....... H01L 51/0032 (2013.01); *H01G 9/2031* (2013.01); *H01L 51/4226* (2013.01); *H01L 2251/303* (2013.01); *H01L 2251/556* (2013.01); *Y02E 10/549* (2013.01); *Y02P 70/521* (2015.11)

(56) References Cited

FOREIGN PATENT DOCUMENTS

| | | | |
|---|---|---|---|
| JP | 2013526003 A | 6/2013 | |
| WO | 2013050222 A1 | 4/2013 | |

OTHER PUBLICATIONS

International Search Report, International Searching Authority, International PCT Application No. PCT/IB2014/062680, dated Aug. 21, 2014, 3 pages.

Lioz Etgar et al.; Mesoscopic CH3NH3PbI3/TiO2 Heterojunction Solar Cells; JACS (Journal of the American Chemical Society); 2012; 4 pages; No. 134; Copyright 2012 American Chemical Society.

James M. Ball et al; Low-Temperature Process Meso-Superstructured to Thin-Film Perovskite Solar Cells; Energy & Environmental Science; 2013; 5 pages; No. 6; RSC Publishing; Copyright The Royal Society of Chemistry 2013.

Japanese Office Action; Japanese Patent Office; Japanese Patent Application No. 2016-522941; dated Aug. 21, 2018; 13 pages.

\* cited by examiner

○ Low temperature TiO$_2$ deposition by TiCl$_4$

SOLAR CELL AND PROCESS FOR PRODUCING THE SAME

This application is a U.S. national stage filing of International Application No. PCT/IB2014/062680 filed on Jun. 27, 2014, which claims priority to European Application No. 13174589.5 filed on Jul. 1, 2013, the contents of each application incorporated herein by reference in their entirety.

TECHNICAL FIELD

The present invention relates to photoanodes, solar cells and methods and processes for producing the same.

PRIOR ART AND THE PROBLEM UNDERLYING THE INVENTION

The conversion of solar energy to electrical current using thin film third generation photovoltaics (PV) is being widely explored for the last two decades. The sandwich/monolithic-type PV devices, consisting of a mesoporous photoanode with an organic/inorganic light harvester, redox electrolyte/solid-state hole conductor, and counter electrode, have gained significant interest due to the ease of fabrication, flexibility in the selection of materials and cost effective production (Grätzel, M. Acc. Chem. Res. 2009, 42, 1788-1798). Recently, the organometallic halide perovskite based on tin ($CsSnX_3$) or lead ($CH_3NH_3PbX_3$) (Etgar, L. et al.; J. Am. Chem. Soc. 2012, 134, 17396-17399), have been introduced in the place of traditional metal-organic complex or organic molecules as the light harvester. The lead perovskite shows a power conversion efficiency (PCE) of 6.54% in liquid electrolyte based devices, while 12.3% in solid state devices (Noh, J. H. et al.; Nano Lett. 2013, dx. doi, org/10.1021).

Unpublished European patent application EP 12179323.6 disclosed a solid-state solar cell comprising a conducting support layer, a surface-increasing scaffold structure, one or more organic-inorganic perovskite layers provided on the scaffold structure and a counter electrode. In the solar cells reported in this reference, remarkable conversion efficiencies were achieved in absence of organic hole transporting material or a liquid electrolyte, which rendered the latter optional.

The optimal protocol for the deposition of $CH_3NH_3PbX_3$ on $TiO_2$ is achieved by the spin-coating of the precursor ($CH_3NH_3X$ and $PbX_2$, X=Cl, Br, I) solution on the mesoporous $TiO_2$ film, followed by low temperature annealing step. The annealing process results in a crystalline $CH_3NH_3PbX_3$ (Noh et al cited above).

The present invention addresses disadvantages of devices comprising liquid electrolytes, such as the problem of solvent evaporation and the penetration of water into the solar cell caused by difficulty in long-term sealing especially in temperature cyclic tests.

The present invention also addresses disadvantages of incomplete pore filling which is observed in devices comprising organic hole conductors. In particular, the hole conductor tends not to penetrate equally through the mesoporous film of sensitized solar cells using a porous semiconductor anode. Furthermore, the present invention addresses the problem of low hole mobility observed with conductors used in the prior art, which are low compared to liquid electrolytes.

In addition to the problems above, low-temperature processable mesoporous metal oxides have been extensively developed for dye sensitized solar cells. However, to date, the most efficient devices still require thermal treatment at 500° C. several times. Previously, in the halide perovskite absorber-based solar cells, high temperature sintering steps were employed for both the compact layer on the TCO (transparent conductive oxide) and the porous electron-transporting oxide film. This fundamentally restricts the utilization of flexible plastic substrate for the fabrication of solar cell. Reducing the processing temperature is important both in terms of reducing the cost and the versatility in employing solar cells on any flexible substrates, and processing multi junction solar cells.

The present invention addresses the problems depicted above.

SUMMARY OF THE INVENTION

Remarkably, in some aspects, the present inventors provided a process for preparing solar cells in a comparatively low-temperature manufacturing process, allowing the use of plastic as substrates for the solar cells. Furthermore, in some aspects, the present inventors provide solar cells comprising a flat and/or smooth semiconductor layer compared to current state of the art devices. Surprisingly, the solar cells of the invention achieve high power conversion efficiencies. In addition, in some aspects, the present inventors surprisingly provide new methods for manufacturing solar cells as well as novel solar cells.

In an aspect, the present invention provides method for producing a solar cell, the method comprising the steps of: providing a layer comprising a current collector; applying a metal oxide layer; applying a sensitizer layer on said metal oxide layer; and, providing a counter electrode.

In an aspect, the present invention provides method for producing a solar cell, the method comprising the steps of: providing a layer comprising a current collector; applying a metal oxide layer to be in electric contact with said current collector; applying a sensitizer layer on said metal oxide layer; and, providing a counter electrode.

In an aspect, the present invention provides method for producing a solar cell, the method comprising the steps of: providing a layer comprising a current collector; applying a metal oxide layer in electric contact with said current collector, wherein said metal oxide layer has a thickness of 200 nm or less; applying a sensitizer layer on said metal oxide layer; and, providing a counter electrode.

In an aspect, the present invention provides a method for producing a solid state solar cell, the method comprising the steps of: providing a layer comprising a current collector; applying a metal oxide layer, wherein said metal oxide layer has a thickness of 200 nm or less; applying a sensitizer layer; and, providing a counter electrode; wherein said metal oxide layer is applied on one selected from (a) directly on said current collector, (b) an optional compact metal oxide underlayer and (c) on an optional nanoporous scaffold layer, characterized in that during and following the step of applying said metal oxide layer up to applying the sensitizer layer 4, the temperature is kept at temperatures at less than 300° C. Preferably, the method comprises the step of applying a hole transporting layer.

In an aspect, the present invention provides a method for producing a solid state solar cell, the method comprising the steps of: applying a metal oxide layer onto one selected from: (a) directly on a layer comprising a current collector, (b) an optional compact metal oxide underlayer, and (c) on an optional nanoporous scaffold layer, so as to obtain a precursor device comprising at least two layers; applying a sensitizer layer on the metal oxide layer of said precursor device; and, providing a counter electrode (5) so as to obtain said solar cell; characterized in that during the method of producing the solar cell, said metal oxide layer 3 is kept at a temperature of lower than 300° C.

In an aspect, the present invention provides a method for producing a solid state solar cell, the method comprising the steps of: providing a layer comprising a current collector; applying a metal oxide layer having a surface area per gram ratio of ≤80 g/m$^2$; preferably ≤70 g/m$^2$ and more preferably ≤60 g/m$^2$; applying a sensitizer layer on the metal oxide layer, said sensitizer comprising a nanocomposite, preferably an organic-inorganic perovskite; and, providing a counter electrode so as to obtain said solar cell. Preferably, the method comprises the step of applying a hole transporting layer.

In an aspect, the present invention provides a solar cell comprising a current collector; a semiconductor, metal oxide layer and/or a blocking layer; a sensitizer layer; and a counter electrode and/or metal layer.

In an aspect, the present invention provides a solar cell comprising a current collector; a metal oxide layer and/or blocking layer having a thickness of less than 200 nm; a sensitizer layer in contact with said semiconductor, metal oxide layer and/or blocking layer; and a counter electrode and/or metal layer; wherein said sensitizer comprises an organic-inorganic perovskite.

In an aspect, the present invention provides a solar cell comprising: a current collector; a compact metal oxide layer and/or a compact blocking layer; a sensitizer layer in contact with said compact semiconductor, metal oxide and/or blocking layer; and a counter electrode and/or metal layer; wherein said sensitizer comprises an organic-inorganic perovskite.

In an aspect, the present invention provides a solar cell comprising a current collector; a semiconductor, metal oxide layer and/or blocking layer; having a surface area per gram ratio of less than 70 m$^2$/g; a sensitizer layer in contact with said semiconductor, metal oxide and/or blocking layer; and a counter electrode and/or metal layer; wherein said sensitizer comprises an organic-inorganic perovskite.

In an aspect, the present invention provides a solid state solar cell comprising a current collector, a metal oxide layer and/or blocking layer, a sensitizer layer in contact with said metal oxide layer, and a counter electrode and/or metal layer, wherein said metal oxide layer has a thickness of less than 200 nm.

In an aspect, the present invention provides a solid state solar cell comprising: a current collector; a metal oxide layer; a sensitizer layer in contact with said metal oxide layer; and a counter electrode and/or metal layer; wherein said metal oxide layer has a thickness of less than 200 nm and a surface area per gram ratio of ≤80 g/m$^2$, preferably ≤70 g/m$^2$, more preferably ≤60 g/m$^2$. Preferably, there is a hole transport layer between said sensitizer layer and said counter electrode.

In an aspect, the present invention provides a photoanode comprising: a metal oxide layer having a thickness of less than 200 nm; and a sensitizer layer in contact with said metal oxide layer, said sensitizer comprising an organic-inorganic perovskite.

In an aspect, the present invention provides a photoanode comprising: a compact metal oxide layer; and a sensitizer layer in contact with said compact metal oxide layer, said sensitizer comprising an organic-inorganic perovskite.

Further aspects and preferred embodiments of the invention are defined herein below and in the appended claims. Further features and advantages of the invention will become apparent to the skilled person from the description of the preferred embodiments given below. Reference to the drawings is made for the purpose of illustration.

DETAILED DESCRIPTION OF THE PREFERRED EMBODIMENTS

The present invention concerns several new methods for producing photoanodes and solar cells and new solar cells. The invention also concerns novel photoanodes and solar cells. In some embodiments, the solar cells of the invention preferably have a novel design, structure, and/or architecture, for example.

The solar cells of the invention preferably comprise a current collector and/or a layer comprising a current collector. The methods of the invention preferably comprise the step of providing a current collector and/or a layer comprising a current collector.

Figure 1:
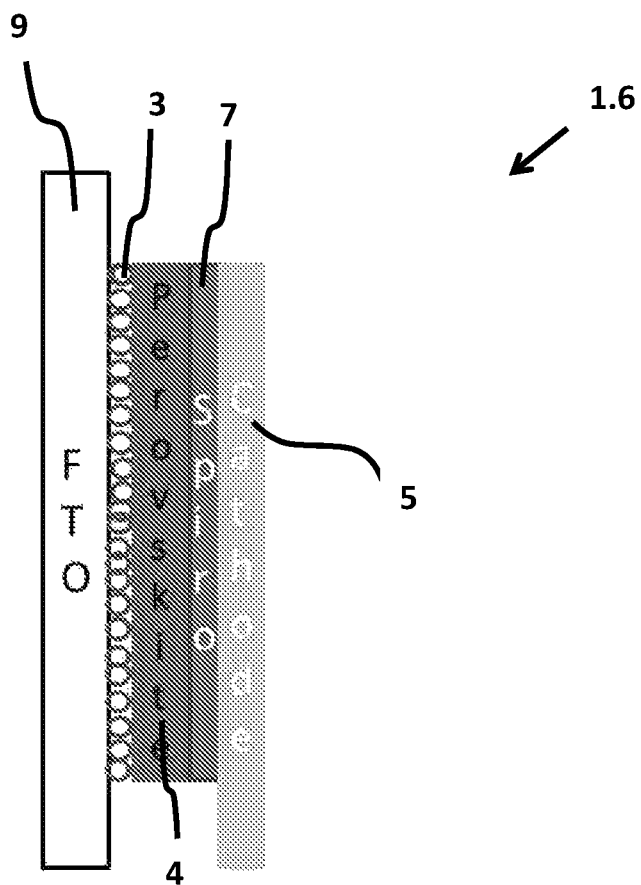
FIG. 1a schematically shows the structure of a solar cell of an embodiment of the invention.
FIG. 1b shows the current density-voltage curves of a device according to an embodiment of the invention. The device exhibits open-circuit potential ($V_{OC}$), short-circuit current density ($J_{SC}$) and fill factor (ff), respectively of 922 mV, 11.5 mA/cm$^2$ and 0.68 resulting in a power conversion efficiency (PCE) of 7.3%.
Figure 1:
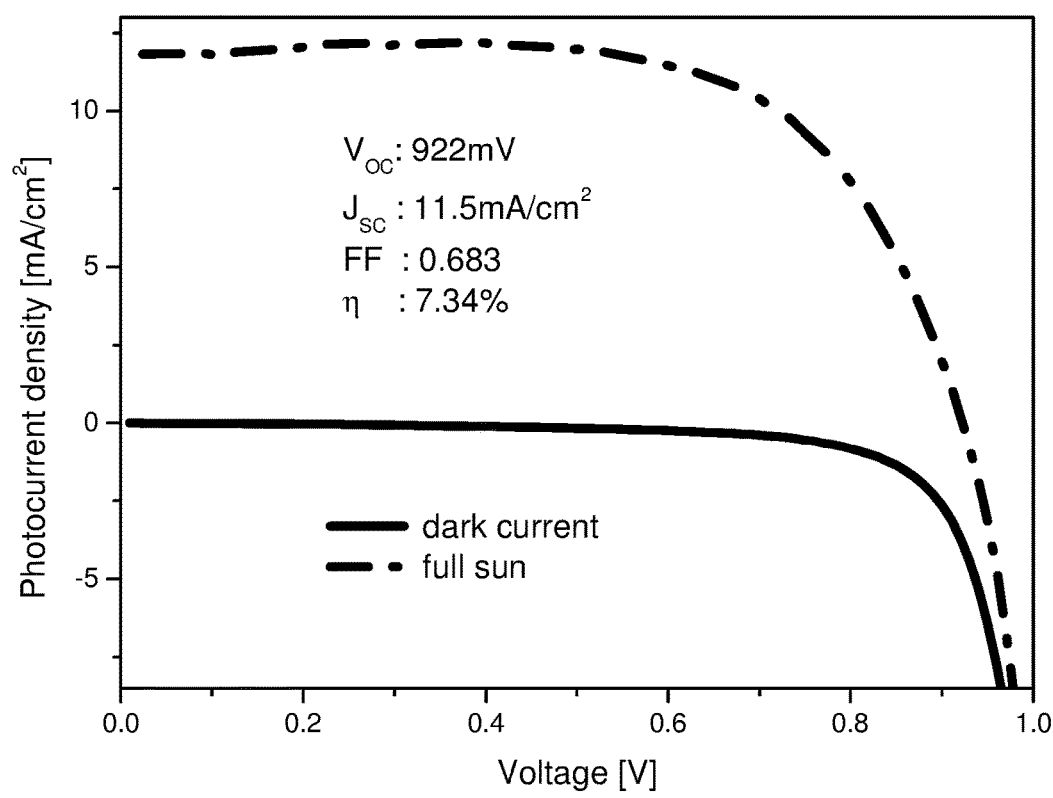

According to an embodiment, the solar cell of the invention preferably comprises a current collector. In FIGS. 4a-4g and FIGS. 5a and 5b, the current collector is generally shown with reference numeral 2. In FIG. 1, FTO contains the current collector. The current collector may be provided in the form of a layer, for example. The current collector preferably forms a continuous layer. The current collector is preferably adapted to collect the current (and/or electrons) generated by the solar cell and to conduct it to an external circuit. The current collector preferably provides the electric front contact of the solar cell.

The current collector thus preferably comprises a conducting or semiconducting material, such as a conducting organic material or a conducting inorganic material, such as a metal, doped metal, a conducting metal oxide or doped metal oxide, for example. As shall be shown further below, in some preferred embodiments, the current collector comprises a material selected from indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$ and zinc oxide, or combinations thereof.

The current collector is preferably arranged to collect and conduct the current generated in the working electrode or photoanode. Therefore, the current collector is preferably in electric contact with the working electrode or photoanode.

For the purpose of the present specification, the expression "in electric contact with" means that electrons or holes can get from one layer to the other layer with which it is in electric contact, at least in one direction. In particular, considering the electron flow in the operating device exposed to electromagnetic radiation, layers through which electrons and/or holes are flowing are considered to be in electric contact. The expression "in electric contact with" does not necessarily mean, and preferably does not mean, that electrons and/or holes can freely move in any direction between the layers.

According to an embodiment, the solar cell of the invention preferably comprises one or more support layer. The support layer preferably provides physical support of the device. Furthermore, the support layer preferably provides a protection with respect to physical damage and thus delimits the solar cell with respect to the outside, for example on at least one of the two major sides of the solar cell. In FIGS. 4b-c and 4e-g and FIG. 5b reference numeral 8 refers to a support layer. According to an embodiment, the solar cell may be constructed by applying the different layers in a sequence of steps, one after the other, onto the support layer. The support layer may thus also serve as a starting support for the fabrication of the solar cell. Support layers may be provided on only one or on both opposing sides of the solar cell.

The support layer, if present, is preferably transparent, so as to let light pass through the solar cell. Of course, if the support layer is provided on the side of the solar cell that is not directly exposed to light to be converted to electrical energy, the support does not necessarily have to be transparent. However, any support layer provided on the side that is designed and/or adapted to be exposed to light for the purpose of energy conversion is preferably transparent. "Transparent" means transparent to at least a part, preferably a major part of the visible light. Preferably, the conducting support layer is substantially transparent to all wavelengths or types of visible light. Furthermore, the conducting support layer may be transparent to non-visible light, such as UV and IR radiation, for example.

Figure 4:
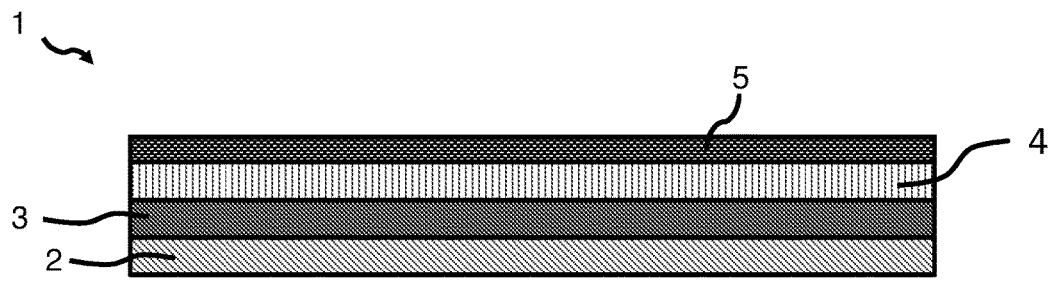
FIGS. 4a to 4g schematically show various different embodiments of the solar cells of the present invention.
Figure 4:
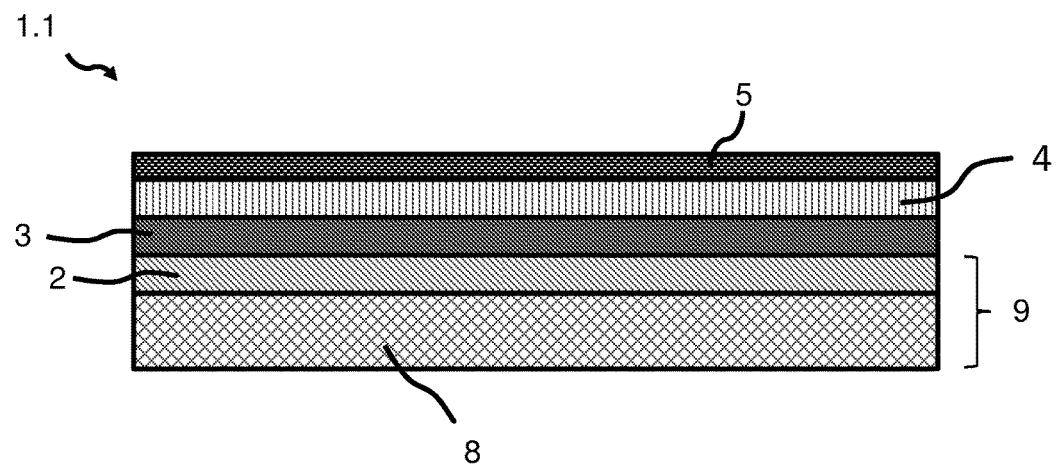
Figure 4:
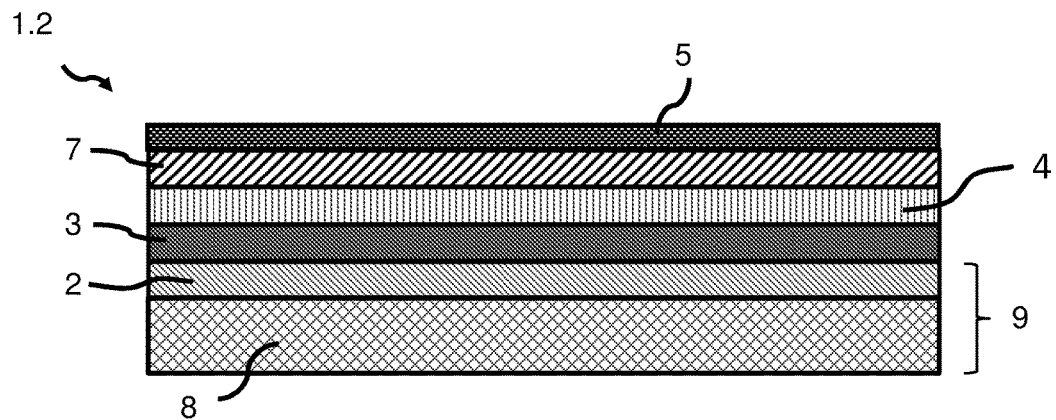
Figure 4:
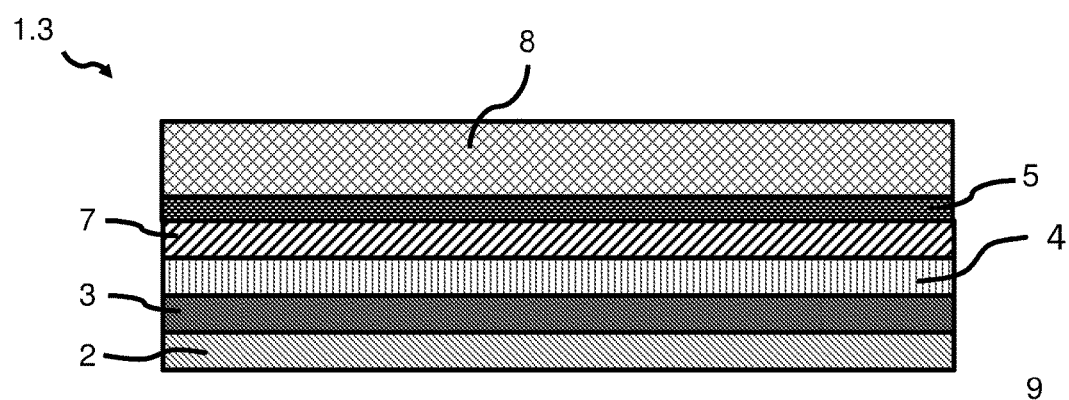
Figure 4:
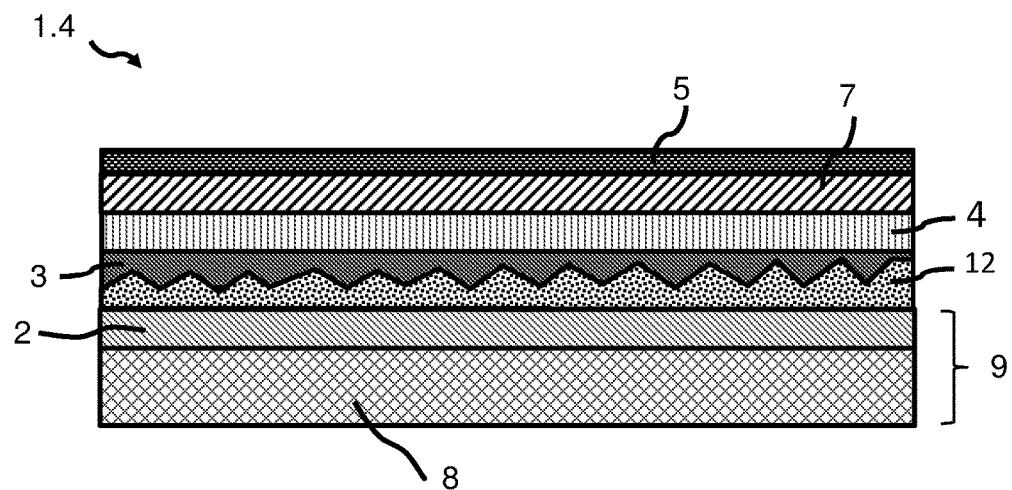
Figure 4:
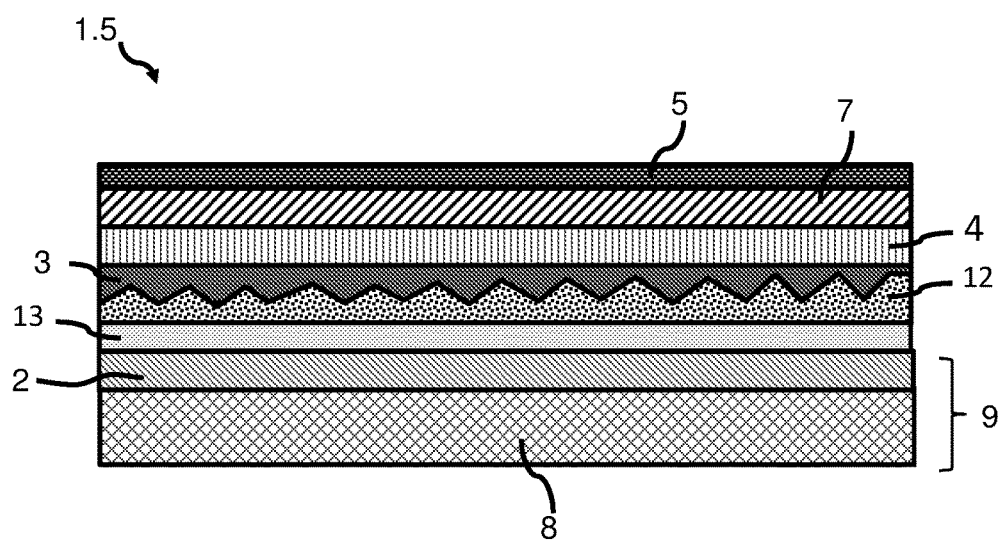
Figure 4:
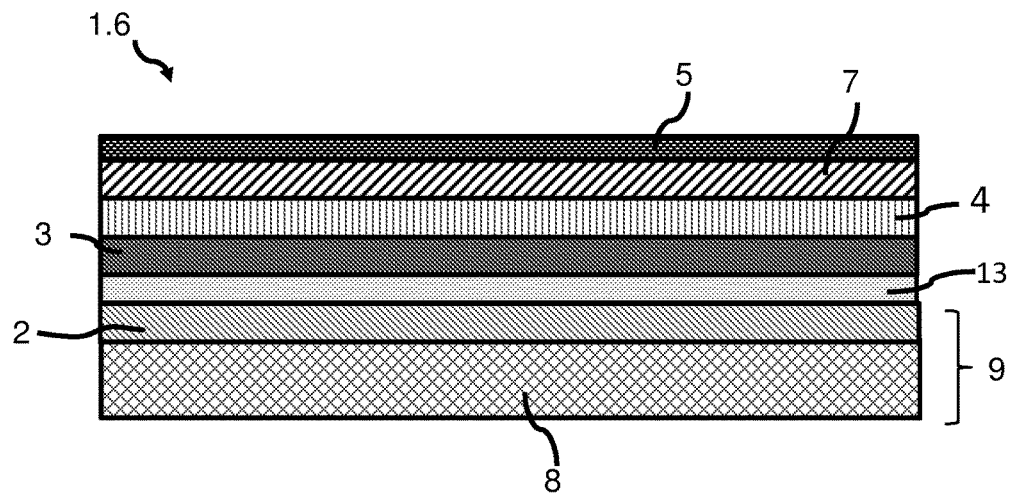

Conveniently, and in accordance with a preferred embodiment of the invention, a conducting support layer 9 is provided, said conducting support layer serving as support as described above as well as current collector 2. The conducting support layer thus replaces or contains the support layer 8 and the current collector 2. The conducting support layer 9 is preferably transparent. Examples of conducting support layers are conductive glass or conductive plastic, which are commercially available. For example, the conducting support layer comprises a material selected from indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$ and zinc oxide, coated on a transparent substrate, such as plastic or glass. In FIGS. 4b, c, e, f and g, reference numeral 9 refers to a conductive support layer, in particular conductive glass or plastic, which comprises both, a support 8 as well as a current collector 2. In FIG. 1, FTO refers to a conductive glass, but could also be conductive plastic.

As is specified in more detail elsewhere in this specification, the process of the invention can advantageously be conducted without sintering. For example, the entire process of preparing the solar cell can be conducted at temperatures below 400° C., preferably below 300° C., more preferably below 200° C. or even below 150° C. This has the advantage that solar cells can be obtained using plastic as a support. Therefore, the present invention encompasses solar cells comprising a plastic support, preferably a conductive plastic as a support, for example.

According to another embodiment, the current collector may also be provided by a conductive metal foil, such as a titanium or zinc foil, for example. Non-transparent conductive materials may be used as current collectors in particular on the side of the device that is not exposed to the light to be captured by the device. Such metal foils have been used as current collectors, for example, in flexible devices, such as those disclosed by Seigo Ito et al, Chem. Commun. 2006, 4004-4006.

The method of the present invention provides the step of providing and/or applying a metal oxide layer. As the device may comprise several metal oxide layers, the present layer may also be referred to as the first oxide layer. This does not imply that this layer is applied first in a succession of steps, nor that it is more important than other layers or components of the solar cell. The word "first" may simply be used for distinguishing this metal oxide layer from other metal oxide layers that may be present in the device, and which may be referred to as "second", "third", etc metal oxide layers. This metal oxide and/or semiconductor layer is indicated with reference numeral 3 in FIGS. 4a to 4g and 5a-b. In FIG. 1, the metal oxide layer 3 is shown as a series of circles (o).

According to an embodiment, the metal oxide layer 3 comprises or consists essentially of Si, SiO$_2$, TiO$_2$, Al$_2$O$_3$, Ga$_2$O$_3$, Y$_2$O$_3$, In$_2$O$_3$, ZrO$_2$, HfO$_2$, SnO$_2$, Fe$_2$O$_3$, ZnO, WO$_3$, MoO$_3$, Nb$_2$O$_5$, CdS, ZnS, PbS, Bi$_2$S$_3$, CdSe, CdTe, SrTiO$_3$, GaP, InP, GaAs, CuInS$_2$, CuInSe$_2$, CaTiO$_3$, SrTiO$_3$, BaSnO$_3$, Zn$_2$SnO$_4$, and combinations thereof.

According to a preferred embodiment, the metal oxide layer 3, consists essentially of or consists of one or more selected from Si, TiO$_2$, SnO$_2$, Fe$_2$O$_3$, ZnO, WO$_3$, Nb$_2$O$_5$, CdS, ZnS, PbS, Bi$_2$S$_3$, CdSe, CdTe, SrTiO$_3$, GaP, InP, GaAs, CuInS$_2$, CuInSe$_2$, and combinations thereof.

Still more preferred materials of the metal oxide layer 3 are Si, TiO$_2$, SnO$_2$, ZnO, WO$_3$, Nb$_2$O$_5$ and SrTiO$_3$, for example. According to the most preferred embodiment, the metal oxide layer comprises, consists essentially of and/or consists of TiO$_2$. Preferably, TiO$_2$ is or comprises anatase. The TiO$_2$ may comprise or consist of rutile. The expression "consists essentially of", for the purpose of this specification, encompasses the presence of additives, such as dopants, for example.

Preferably, the metal oxide layer or first metal oxide layer is a semiconductor. This layer may thus also be referred to as metal oxide layer.

The metal oxide layer is preferably comparatively thin. According to an embodiment, the metal oxide layer 3 has a thickness of less than 600 nm. Preferably, said metal oxide layer has a thickness of less than 300 nm, preferably less than 200 nm, less than 150 nm, less than 100 nm, more preferably less than 70 nm, even more preferably less than 50 nm and most preferably 30 nm or less.

According to a preferred embodiment, said metal oxide layer 3 has a thickness of 1 to 40 nm, preferably 3 to 35 nm, more preferably 5 to 30 nm, even more preferably 7 to 25 nm and most preferably 10 to 20 nm. It is surprising that solar cells having high efficiency can be obtained with such thin metal oxide layers.

In an embodiment, the metal oxide layer 3 is and/or functions as a blocking layer. For example, the blocking layer 3 allows electrons passing from the sensitizer 4 to the layer below the metal oxide layer 3, which may be selected from: a current collector 2, an underlayer 13 and a mesoporous scaffold layer 12, for example. However, the metal oxide layer preferably hinders or prevents electron flow in the opposite direction and/or charge recombination. For example, the metal oxide layer 3 hinders electrons from passing from the current collector 2 to the sensitizer layer 4 and/or to the hole transport layer 7, if the latter is present.

In some embodiments, the metal oxide layer 3 is applied in any suitable way, for example in accordance with standard procedures reported for depositing semiconductor layers for producing dye-sensitized solar cells (DSCs). According to a preferred embodiment, the metal oxide layer 3 is applied by way of a thin film deposition method, for example by a chemical and/or physical deposition process. Chemical deposition encompasses plating, chemical bath deposition (CBD, which is the same as chemical solution deposition CSD), spin coating, chemical vapor deposition (CVD), plasma enhanced CVD, atomic layer deposition (ALD), for example. Physical deposition encompasses physical vapor deposition, such as thermal vapor deposition, sputtering, pulsed laser deposition, cathodic arc deposition and electro-spray deposition.

According to a preferred embodiment, said metal oxide layer 3 is applied by way of a low-temperature deposition process. "Low-temperature" preferably refers to a temperature that is lower than (or does not exceed) 400° C., preferably lower than 300° C., more preferably lower than 200° C., even more preferably lower than 150° C., for example lower than 130° C. and most preferably even lower than 100° C.

Preferably, said metal oxide layer 3 is applied by a process that does not require a heat treatment exceeding 100° C., 120° C., 130° C., 150° C., 200° C., 300° C., or even 400° C. Such high temperatures are typically used in sintering steps, required for annealing semiconductor nanoparticles in prior art devices, for example. For example, in typical prior art devices, metal oxide particles, in particular nanoparticles, for example $TiO_2$ nanoparticles, are deposited by screen printing or deposited by the doctor blade technique, for example, followed by a sintering step. Such as deposition step involving a high temperature treatment is preferably absent in some embodiments of the method of the invention.

In some embodiments of the method of the invention a step of sintering is absent. "Sintering" is also known as "firing" and "annealing". In some embodiments, the device of the invention lacks a sintered metal oxide layer.

In preferred embodiments, said metal oxide layer 3 is applied by one selected from atomic layer deposition (ALD) and chemical bath deposition (CBD). Preferably, the metal oxide layer 3 is applied by CBD. CBD typically results in layers having a thickness as specified elsewhere for the metal oxide layer. CBD typically results in a layer that is compact as such. When deposited on a porous surface, CBD generally maintains or in some cases slightly reduces the porosity of the layer onto which deposition takes place.

Preferably, said CBD is conducted at a temperature below 300° C., preferably below 200° C., more preferably below 150° C., for example below 130° C. or below 120° C., most preferably below 100° C.

According to an embodiment, said metal oxide layer 3 is applied by treatment with a solution comprising one or more precursors of the semiconductor and/or metal oxide. The metal oxide layer may be formed directly in the solution if all components for forming the layer are present. Alternatively, said metal oxide layer 3 is applied by a succession of steps, wherein a layer on which the metal oxide is to be applied is immersed in two or more differently solutions or baths successively, or is immersed in solution and exposed to a gas so as to provide all components forming the layer 3.

According to a preferred embodiment, said metal oxide layer 3 is applied by treatment with a solution comprising a precursor of the metal oxide 4. For example, the precursor is $TiCl_4$. For example, a starting layer or surface, for example a surface comprising a conductive layer, is immersed into a precursor solution, which may comprise $TiCl_4$, for example. Preferably, the solution is heated to about 60-90° C., for example 65-80° C. For example, the starting layer or surface is repeatedly immersed into and withdrawn from the precursor solution, with washing steps take place after withdrawal from the precursor solution. Washing steps may comprise rinsing with water and/or alcohol, for example immersing shortly in a bath comprising a washing solution. In accordance with an embodiment, the precursor solution is an aqueous solution of $TiCl_4$.

Layers obtained by CBD as depicted above may have thicknesses as specified elsewhere with respect to the metal oxide layer 4, for example a thickness of up to 100 nm, but typically thicknesses of <70 nm, for example <50 nm are obtained.

The particularity of some aspects of the invention is the fact that the solar cell can be produced at "low temperatures" as defined elsewhere in this specification. However, in other aspects, a high temperature treatment, for example sintering, in not excluded. In some embodiments, a high temperature treatment is absent at least during specific time frames or during specific steps of the method of the invention. These time frames or periods are preferably defined elsewhere in this specification. In other embodiments, a high temperature treatment is absent in the entire process of fabrication altogether. The latter embodiments allow the production of plastic-based solar cells. As plastic can deteriorate at temperatures above about 200° C. or above 150°; these temperatures are preferably not exceeded in the methods of the invention. These statements concern the process of preparing the solar cell as such and do not exclude that starting materials used for producing the solar cell of the invention, are obtained at higher temperatures.

In accordance with an embodiment, said metal oxide layer 3 is not sintered. Preferably, during the entire method of preparing the solar cell, a sintering step and/or a heat treatment as specified elsewhere in this specification is absent.

Preferably, a process step involving heating to over 400° C. is absent in the method of the invention. Preferably, a process step involving heating to over 300° C. is absent. Yet more preferably, a process step involving heating to over 200° C. is absent. Even more preferably, a process step involving heating to over 150° C. is absent. Most preferably, a process step involving heating to over 100° C. is absent in the method of the invention. The expression "in the method of the invention" encompasses at least all steps from applying said metal oxide layer 3 to the application of the counter electrode 5. The expression also refers to optional process steps that are not specifically mentioned, in which a high temperature heating step as defined above is also absent.

In accordance with an embodiment, said metal oxide layer 3 is not subjected to a temperature of more than 400° C., preferably more than 300° C., more preferably more than 200° C. and most preferably more than 150° C. Most preferably, said metal oxide layer 3 is not subjected to a temperature of more than 130° C., in particular 100° C. This does not exclude the possibility that some other parts of the solar cell have been exposed to such high temperatures during the fabrication of the device.

In accordance with an embodiment, during the preparation of the solar cell and/or during the method of the invention, said metal oxide layer 3 is constantly and continuously kept at a temperature of ≤400° C., preferably ≤300° C., more preferably ≤200° C., even more preferably ≤150° C., for example ≤130° C., and most preferably ≤100° C.

The method of the invention generally starts with applying a layer on said counter electrode 2, preferably on a conductive support 9, which layer is preferably a metal oxide layer, but could be another material. For example, the preparation of the precursor device defined below is the start of the method of the invention. The method of the invention may end with applying the counter electrode. However, the solar cell is preferably not exposed to the high temperatures specified herein even after fabrication is finalized. The expression "the entire method" encompasses the entire period and all process steps from the start to the finalization of the solar cell, including steps that are not mandatory for the purpose of the invention and which are thus not specified herein.

In accordance with preferred embodiment, the entire method of preparing the solar cell of the invention excludes a step of heating to more than 400° C., preferably more than 300° C., more preferably more than 200° C. and most preferably more than 150° C. Most preferably, the entire method excludes a step of heating to more than 130° C., in particular more than 100° C.

In accordance with preferred embodiment, the entire method of preparing the solar cell of the invention takes place at a temperature of ≤400° C., preferably ≤300° C., more preferably ≤200° C., even more preferably ≤150° C., for example ≤130° C. and/or ≤120° C., and most preferably ≤100° C. In the words, during the entire process of preparing the solar cell of the invention, temperature is kept below and/or does not exceed the above indicated temperatures.

In accordance with an embodiment, during and following the step of applying said metal oxide layer 3 up to before and during the step of applying the sensitizer layer 4, the solar cell to be fabricated is consistently kept at temperatures lower than 400° C., preferably lower than 300° C., even more preferably lower than 200° C., lower than 150° C., lower than 130° C. and most preferably lower than 100° C., preferably during the entire method of the invention.

In accordance with an embodiment, the solar cell to be fabricated and/or the precursor device is consistently kept at temperatures lower than 400° C., preferably lower than 300° C., even more preferably lower than 200° C., lower than 150° C., lower than 130° C. and most preferably lower than 100° C. during the method of preparing said solar cell.

For the purpose of this specification, the expression "solar cell to be fabricated" or "partially assembled device/solar cell" refers to a partially assembled solar cells occurring during the various stages of the method of preparation of the invention. The "solar cell to be fabricated" is not yet functional. For example, the "solar cell to be fabricated" may comprise a current collector 2 and a metal oxide layer 3 but lacking all other parts of the solar cell. A partially assembled solar cell comprising the 2, 3 and 4 but lacking 5 is also a "solar cell to be fabricated" for the purpose of this specification. A "precursor device" as defined below is also encompassed by "solar cell to be fabricated.

Figure 5:
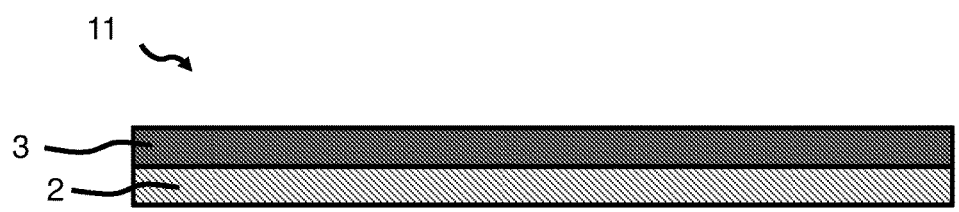
FIGS. 5a and 5b schematically show various different embodiments of precursor devices for preparing the solar cells of the present invention.
Figure 5:
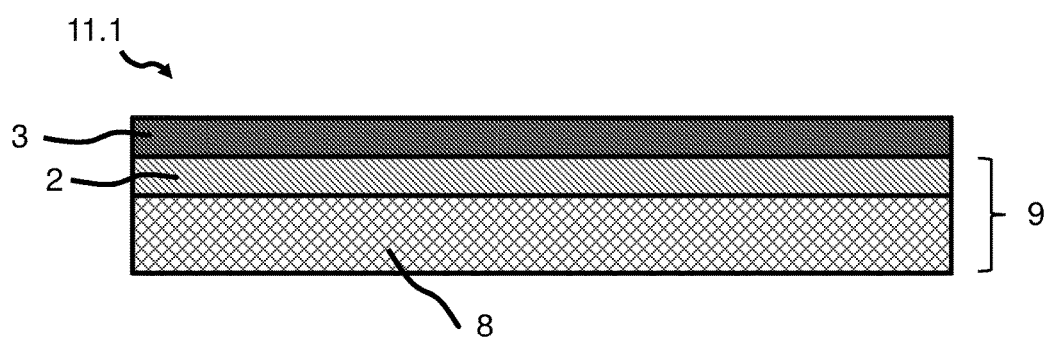

For the purpose of the present specification, a "precursor device" is a solar cell to be fabricated, comprising at least a current collector 2 and a metal oxide layer 3, but lacking a sensitizer layer 4 and a counter electrode 5. Therefore, the "precursor device" also lacks the optional charge transport layer 7. Exemplary precursor devices 11 and 11.1 are shown in FIGS. 5a and 5b.

The present invention encompasses several embodiments as to where and/or on what layer the metal oxide layer 3 is applied, for example deposited. According to a preferred embodiment, the metal oxide layer 3 is applied on a surface and/or layer comprising at least a current collector 2 and/or a conductive support 9.

According to an embodiment, the metal oxide layer 3 is applied on one selected from: (a) directly on said current collector 2; (b) an optional compact metal oxide layer 13; and (c) on an optional nanoporous metal oxide layer 12.

In case of options (b) and (c), said underlayer and scaffold are preferably part of a partially assembled device comprising at least a current collector 2 and/or a conductive support 9 and, in addition, said underlayer 13 and/or said scaffold layer 12.

In accordance with a preferred embodiment (option (a) above), the metal oxide layer 3 is applied on said current collector 2, for example onto a conductive support 9. In this embodiment, other metal oxide layers and/or scaffolds between said current collector 2 and said metal oxide layer 3 are absent in the solar cell of the invention. In this embodiment, the metal oxide layer 3 is in direct contact with said current collector layer 2. Such embodiments are illustrated in FIGS. 4a-d. As will be specified elsewhere, in this embodiment the metal oxide layer 3 will generally form a comparatively smooth, non-porous surface.

In accordance with an embodiment (option (b) above), the metal oxide layer 3 is applied on an optional compact metal oxide layer 13. An optional compact metal oxide layer 13 is present in the embodiment shown in FIG. 4g. In this case, the metal oxide layer 3 may be a first metal oxide layer and the compact metal oxide layer 13 may form a second metal oxide layer (although it is noted that the second metal oxide layer is generally applied before the first metal oxide layer 3 during device fabrication). The compact metal oxide layer 13 may also be referred to as compact metal oxide underlayer. The first metal oxide layer 3 may also be a compact metal oxide layer.

If a compact metal oxide underlayer 13 is present, the latter may be deposited as is conventional for underlayers in DSCs, for example. The underlayer 13 preferably has a thickness of 1-120 nm (nanometer). It may be applied, for example, by atomic layer deposition ALD or CBD. In this case, the thickness of this layer is preferably 1 nm to 25 nm. The underlayer may also be deposited by spray pyrolysis, for example, which typically results in a thickness of preferably 10 nm to 120 nm. In some aspects of the device and method of the invention, the underlayer 13 is sintered, for example before applying metal oxide layer 3. In some other embodiments the underlayer 13 is not sintered.

In accordance with an embodiment (option (c) above), the metal oxide layer 3 is applied on an optional nanoporous scaffold layer 12. Embodiments of solar cells comprising a nanoporous scaffold layer 12 are shown in FIGS. 4e and 4f. In FIG. 4f, the nanoporous scaffold layer 13 is deposited onto a metal oxide underlayer 13. In FIG. 4e, the nanoporous scaffold layer 13 is deposited onto the current collector 2.

The scaffold layer 13, if present, preferably comprises, is based on or prepared by using nanoparticles. The nanoparticles are preferably applied on said current collector and/or on a underlayer, if present. The expression "nanoparticles" encompasses particles or particulate elements, which may have any form, in particular also so-called nanosheets, nanocolumns and/or nanotubes, for example. Nanosheets made from anatase $TiO_2$ have been reported by Etgar et al., Adv. Mater. 2012, 24, 2202-2206, for example.

Nanoporous (mesoporous) scaffolds may be prepared by screen printing or spin coating, for example as is conventional for the preparation of porous semiconductor (e.g. $TiO_2$) layers in DSCs. See for example, Etgar et al. cited above. Nanoporous semiconductor scaffold structures and layers have been disclosed, for example, in EP 0333641 and EP 0606453.

In some aspects of the device and method of the invention, the scaffold layer 12 is sintered, for example before applying metal oxide layer 3. In some other embodiments the scaffold layer 13 is not sintered. It is noted that in the prior art, nanoporous scaffold are generally sintered. In some aspects of the invention, a sintered nanoporous scaffold layer is absent. In some embodiments, the invention encompasses a non-sintered nanoporous scaffold.

If a scaffold layer 12 is present it preferably comprises or is made of a metal oxide. Preferably, the scaffold layer comprises a semiconductor metal oxide. Layer 12 may also be referred to as metal oxide scaffold layer. If a compact metal oxide underlayer 13 is present, the scaffold layer 12 may also be referred to as third metal oxide layer.

The metal oxide layer 3, the optional underlayer 13 if present, and the optional nanoporous scaffold layer 12 may comprise a metal oxide material independently selected from the same materials as specified for the metal oxide layer 3 elsewhere in this specification, for example.

The metal oxide layer 3, the optional underlayer 13 if present, and the optional nanoporous scaffold layer 12 may comprise and/or consist essentially of the same or different materials.

Since the presence of a nanoporous scaffold is only optional, the invention encompasses a method and devices in which the scaffold layer 12 is absent. Accordingly, in some embodiments, the solar cell lacks a layer based on and/or prepared from "nanoparticles", in particular it may lack a layer comprising sintered nanoparticles.

As the skilled person will understand, the invention encompasses applying the metal oxide layer 3 onto a surface that is smooth and/or flat. This is interesting, because the sensitizer is preferably deposited on said metal oxide layer 3, which means that the entire photoanode (metal-oxide-sensitizer unit) will not have a substantially increased surface. Further below, preferred embodiments concerning the deposition of the sensitizer will be discussed in more detail.

For the purpose of the present specification, the characteristics of "smooth" or "flat" surface refer to the structure of the surface on a mesoscopic scale. For example, under process steps (a) and/or (b) specified above, the metal oxide layer 3 is deposited directly either on the current collector 2 or on a compact underlayer 13. The current collector 2 (for example provided as a conductive support layer 9) has a flat surface on a mesoscopic scale, compared to a nanoporous scaffold layer 12, for example. Similarly, while the optional compact underlayer 13 may exhibit some porosity, depending on how it is prepared, it is clearly less porous than a scaffold layer 12.

One of the surprising findings of some aspects of this invention is that solar cells having a high efficiency can be obtained while depositing a metal oxide layer on a smooth surface. Actually, before nanoporous scaffolds were developed DSCs had only low conversion efficiencies (η), hardly exceeding a few (e.g. 1 to 3) percent.

The present invention thus surprisingly provides solar cells comprising a sensitizer 4 deposited on a metal oxide layer 3, wherein said metal oxide layer 3 is non-porous, in particular non-mesoporous or non-nanoporous.

In some embodiments, the present invention provides a solar cell comprising a sensitizer 4 deposited on a metal oxide layer 3, wherein said metal oxide layer 3 has a surface area per gram ratio of ≤(lower than or equal to) 150 $m^2/g$, more preferably ≤100 $m^2/g$, even more preferably ≤80 $m^2/g$, still more preferably ≤70 $m^2/g$ and most preferably ≤60 $m^2/g$.

In more preferred embodiments, has a surface area per gram ratio of ≤50 $m^2/g$, ≤40 $m^2/g$, ≤30 $m^2/g$, ≤20 $m^2/g$, ≤10 $m^2/g$, ≤5 $m^2/g$. According to an embodiment, said surface area per gram ratio is smaller than 20.

The surface area per gram ratio is also known as specific surface area measured with the BET gas adsorption method.

In some embodiments, the present invention provides a solar cell comprising a sensitizer 4 deposited on a metal oxide layer 3, wherein said metal oxide layer 3 has a porosity of ≤90%, preferably ≤80%, even more preferably ≤70%, and most preferably ≤50%. In preferred embodiments, the metal oxide layer 3 has a porosity of ≤40%, preferably ≤30%, even more preferably ≤20%, and most preferably ≤10%.

In some embodiments, said metal oxide layer 3 has an average pore width of <20 nm, preferably <15 nm, more preferably <10 nm, even more preferably <8 nm, most preferably <5 nm.

In some embodiments, said metal oxide layer 3 is not mesoporous. "Mesoporous", for the purpose of the present specification, refers to pores with diameters of 2-50 nm.

In some embodiments, said metal oxide layer 3 is not nanocrystalline.

Since the metal oxide layer 3 may be relatively thin, for example ≤50 nm, or as specified elsewhere in this specification, the above characteristics in terms of surface area per gram ratio, porosity, the absence of pores on the mesoscale, for example, generally and/or approximately also apply to the layer on which the metal oxide layer 3 is deposited. It is noted that deposition of the metal oxide layer by CBD (also ALD), for example, is expected to reduce surface area per gram ratio, porosity, average pore width to some extent, depending on the thickness of the metal oxide layer 4.

The invention encompasses solar cells comprising a sensitizer 4 and the step of applying a sensitizer layer 4, for example on the metal oxide layer 3. The sensitizer is preferably a light-absorbing compound or material. Preferably, the sensitizer is a pigment.

The sensitizer layer 4 may comprise one or more of the group consisting of: organometallic sensitizing compounds, metal free organic sensitizing compounds, inorganic sensitizing compounds such as quantum dots, Sb2S3 (Antimonysulfide, for example in the form of thin films), aggregates of organic pigments, nanocompsosites, in particular organic-inorganic perovskites, and combinations of the aforementioned. For the purpose of the invention, it is in principle possible to use any type of dyes or sensitizer, including combinations of different types of dyes or different dyes of the same type.

Organometallic sensitizers are disclosed, for example, in EP0613466, EP0758337, EP 0983282, EP 1622178, WO2006/038823, WO2009/107100, WO2010/055471 and WO2011/039715. Exemplary organic dyes are those disclosed in WO2009/098643, EP1990373, WO2007/100033 for example. An organic dye was also used in European patent application no. EP11161954.0. and in PCT/IB2011/054628.

According to a preferred embodiment, the sensitizer layer 4 comprises, consists essentially of or consists of a nanocomposite material. According to a preferred embodiment, the sensitizer layer 4 comprises, consists essentially of or consists of an organic-inorganic perovskite.

The term "perovskite", for the purpose of this specification, refers to the "perovskite structure" and not specifically to the perovskite material, $CaTiO_3$. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry $AMX_3$, where "A" and "M" are cations and "X" is an anion. The "A" and "M" cations can have a variety of charges and in the original Perovskite mineral (CaTiO3), the A cation is divalent and the M cation is tetravalent. For the purpose of this invention, the perovskite formulae includes structures having three (3) or four (4) anions, which may be the same or different, and/or one or two (2) organic cations, and/or metal atoms carrying two or three positive charges, in accordance with the formulae presented elsewhere in this specification.

Organic-inorganic perovskites are hybrid materials exhibiting combined properties of organic composites and inorganic crystalline. The inorganic component forms a framework bound by covalent and ionic interactions which provide high carrier mobility. The organic component helps in the self-assembly process of those materials, it also enables the hybrid materials to be deposited by low-cost technique as other organic materials. Additional important property of the organic component is to tailor the electronic properties of the organic-inorganic material by reducing its dimensionality and the electronic coupling between the inorganic sheets.

The structure of the organic-inorganic perovskites are analogous to multilayer quantum well structures, with semiconducting inorganic sheets alternating with organic layers having a large energy gap. In one possibility, the conduction band of the inorganic layers is substantially below that of the organic layers, and the valence band of the inorganic layers is similarly above that of the organic layers. Therefore, the inorganic sheets act as quantum wells for both electrons and holes. Another option is when the bandgaps for the organic and inorganic layers can be offset, leading to a type II heterostructure in which the wells for the electrons and holes are in different layers.

Those structures permit their use as sensitizer, which can inject electrons to the metal oxide layer. The perovskite may also function as hole conductor, as discussed in more detail elsewhere in this specification.

According to an embodiment, the organic-inorganic perovskite material that is used and/or obtained in the one or more perovskite layer preferably comprises a perovskite-structure of any one of formulae (I), (II), (III), (IV), (V) and/or (VI) below:

$$AA'MX_4 \tag{I}$$

$$AMX_3 \tag{II}$$

$$AN'N_{2/3}X_4 \tag{III}$$

$$AN_{2/3}X_3 \tag{IV}$$

$$BN_{2/3}X_4 \tag{V}$$

$$BMX_4 \tag{VI}$$

wherein,

A and A' are organic, monovalent cations that are independently selected from primary, secondary, tertiary or quaternary organic ammonium compounds, including N-containing heterorings and ring systems, A and A' having independently from 1 to 60 carbons and 1 to 20 heteroatoms;

B is an organic, bialent cation selected from primary, secondary, tertiary or quaternary organic ammonium compounds having from 1 to 60 carbons and 2-20 heteroatoms and having two positively charged nitrogen atoms;

M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2-}$, $Eu^{2+}$, or $Yb^{2+}$;

N is selected from the group of $Bi^{3+}$ and $Sb^{3+}$; and, the three or four X are independently selected from $Cl^-$, $Br^-$, $I^-$, $NCS^-$, $CN^-$, and $NCO^-$.

In particular, the three or four X may be the same or different. For example, in $AMX_3$ (formula II) may be expressed as formula (II') below:

$$AMX^i X^{ii} X^{iii} \tag{II'}$$

wherein $X^i$, $X^{ii}$, $X^{iii}$ are independently selected from $Cl^-$, $Br^-$, $I^-$, $NCS^-$, $CN^-$, and $NCO^-$, preferably from halides ($Cl^-$, $Br^-$, $I^-$), and A and M are as defined elsewhere in this specification. $X^i$, $X^{ii}$, $X^{iii}$ may thus be the same or different in this case. The same principle applies to the perovskites of formulae (I) and (III)-(VI) and the more specific embodiments of formulae (VIII) to (XIV) below. In case of $AA'MX_4$ (formula I), for example, formula (I') applies:

$$AA'M\ X^i X^{ii} X^{iii} X^{iv} \tag{I'}$$

wherein $X^i$, $X^{ii}$, $X^{iii}$ are independently selected from $Cl^-$, $Br^-$, $I^-$, $NCS^-$, $CN^-$, and $NCO^-$, preferably from halides ($Cl^-$, $Br^-$, $I^-$).

Preferably, if $X^i$, $X^{ii}$, $X^{iii}$ in formulae (II) and (IV) or $X^i$, $X^{ii}$, $X^{iii}$, $X^{iv}$ in formulae (I), (III), (V) or (VI) comprise different anions X, there are not more than two different anions. For example, $X^i$ and $X^{ii}$ being the same with $X^{iii}$ being an anion that is different from $X^i$ and $X^{ii}$.

According to a preferred embodiment, the perovskite material has the structure selected from one or more of formulae (I) to (III), preferably (II) or (II').

According to a preferred embodiment, said organic-inorganic perovskite layer comprises a perovskite-structure of any one of the formulae (VIII) to (XIV):

$$APbX_3 \tag{VIII}$$

$$ASnX_3 \tag{IX}$$

$$ABiX_4 \tag{X}$$

$$AA'PbX_4 \tag{XI}$$

$$AA'SnX_4 \tag{XII}$$

$$BPbX_4 \tag{XIII}$$

$$BSnX_4 \tag{XIV}$$

wherein A, A', B and X are as defined elsewhere in this specification. Preferably, X is preferably selected from $Cl^-$, $Br^-$ and $I^-$, most preferably X is $I^-$.

According to a preferred embodiment, said organic-inorganic perovskite layer comprises a perovskite-structure of the formulae (VIII) to (XII), more preferably (VIII) and/or (IX) above.

According to an embodiment, A and A', for example in AX and/or in any one of formulae (I) to (IV), and (VIII) to (XII), are monovalent cations selected independently from any one of the compounds of formulae (1) to (8) below:

 (1)

 (2)

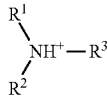 (3)

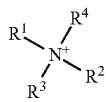 (4)

 (5)

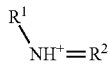 (6)

 (7)

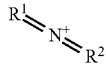 (8)

wherein, any one of $R^1$, $R^2$, $R^3$ and $R^4$ is independently selected from C1-C15 organic substituents comprising from 0 to 15 heteroatoms.

According to an embodiment of said C1-C15 organic substituent any one, several or all hydrogens in said substituent may be replaced by halogen and said organic substituent may comprise up to fifteen (15) N, S or O heteroatoms, and wherein, in any one of the compounds (2) to (8), the two or more of substituents present ($R^1$, $R^2$, $R^3$ and $R^4$, as applicable) may be covalently connected to each other to form a substituted or unsubstituted ring or ring system. Preferably, in a chain of atoms of said C1-C15 organic substituent, any heteroatom is connected to at least one carbon atom. Preferably, neighboring heteroatoms are absent and/or heteroatom-heteroatom bonds are absent in said C1-C15 organic substituent comprising from 0 to 15 heteroatoms.

According to an embodiment any one of $R^1$, $R^2$, $R^3$ and $R^4$ is independently selected from C1 to C15 aliphatic and C4 to C15 aromatic or heteroaromatic substituents, wherein any one, several or all hydrogens in said substituent may be replaced by halogen and wherein, in any one of the compounds (2) to (8), the two or more of the substituents present may be covalently connected to each other to form a substituted or unsubstituted ring or ring system.

According to an embodiment, B is a bivalent cation selected from any one of the compounds of formulae (9) and (10) below:

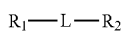 (9)

 (10)

wherein, in the compound of formula (9), L is an organic linker structure having 1 to 10 carbons and 0 to 5 heteroatoms selected from N, S, and/or O, wherein any one, several or all hydrogens in said L may be replaced by halogen;

wherein any one of $R_1$ and $R_2$ is independently selected from any one of the substituents (20) to (25) below:

 (20)

 (21)

 (22)

 (23)

 (24)

 (25)

wherein the dotted line in the substituents (20) to (25) represents the bond by which said substituent is connected to the linker structure L;

wherein $R^1$, $R^2$, and $R^3$ are independently as defined above with respect to the compounds of formulae (1) to (8);

wherein $R_1$ and $R_2$, if they are both different from substituent (20), may be covalently connected to each other by way of their substituents $R^1$, $R^2$, and/or $R^3$, as applicable, and wherein any one of $R^1$, $R^2$, and $R^3$, if present, may be covalently connected to L or the ring structure of compound (10), independently from whether said substituent is present on $R_1$ or $R_2$;

and wherein, in the compound of formula (10), the circle containing said two positively charged nitrogen atoms represents a substituted or unsubstituted aromatic ring or ring system comprising 4 to 15 carbon atoms and 2 to 7 heteroatoms, wherein said nitrogen atoms are ring heteroatoms of said ring or ring system, and wherein the remaining of said heteroatoms may be selected independently from N, O and S and wherein $R^5$ and $R^6$ are independently selected from H and from substituents as $R^1$ to $R^4$. Halogens substituting hydrogens totally or partially may also be present in addition to and/or independently of said 2 to 7 heteroatoms.

Preferably, if the number of carbons is in L is impair, the number of heteroatoms is smaller than the number of carbons. Preferably, in the ring structure of formula (10), the number of ring heteroatoms is smaller than the number of carbon atoms.

According to an embodiment, L is an aliphatic, aromatic or heteroaromatic linker structure having from 1 to 10 carbons.

Preferably, the dotted line in substituents (20) to (25) represents a carbon-nitrogen bond, connecting the nitrogen atom shown in the substituent to a carbon atom of the linker.

According to an embodiment, in the compound of formula (9), L is an organic linker structure having 1 to 8 carbons and from 0 to 4 N, S and/or O heteroatoms, wherein any one, several or all hydrogens in said L may be replaced by halogen. Preferably, L is an aliphatic, aromatic or heteroaromatic linker structure having 1 to 8 carbons, wherein any one, several or all hydrogens in said L may be replaced by halogen.

According to an embodiment, in the compound of formula (9), L is an organic linker structure having 1 to 6 carbons and from 0 to 3 N, S and/or O heteroatoms, wherein any one, several or all hydrogens in said L may be replaced by halogen. Preferably, L is an aliphatic, aromatic or heteroaromatic linker structure having 1 to 6 carbons, wherein any one, several or all hydrogens in said L may be replaced by halogen.

According to an embodiment, in the compound of formula (9), said linker L is free of any O or S heteroatoms. According to an embodiment, L is free of N, O and/or S heteroatoms.

According to an embodiment, in the compound of formula (10), the circle containing said two positively charged nitrogen atoms represents a substituted or unsubstituted aromatic ring or ring system comprising 4 to 10 carbon atoms and 2 to 5 heteroatoms (including said two ring N-atoms).

According to an embodiment, said ring or ring system in the compound of formula (10) is free of any O or S heteroatoms. According to an embodiment, said ring or ring system in the compound of formula (10) is free of any further N, O and/or S heteroatoms, besides said two N-ring atoms. This does not preclude the possibility of hydrogens being substituted by halogens.

As the skilled person will understand, if an aromatic linker, compound, substituent or ring comprises 4 carbons, it comprises at least 1 ring heteroatom, so as to provide an aromatic moiety.

According to an embodiment, any one of $R^1$, $R^2$, $R^3$ and $R^4$ is independently selected from C1 to C8 organic substituents comprising, from 0 to 4 N, S and/or O heteroatom, wherein, independently of said N, S or O heteroatoms, any one, several or all hydrogens in said substituent may be replaced by halogen, and wherein two or more of substituents present on the same cation may be covalently connected to each other to form a substituted or unsubstituted ring or ring system. Preferably, any one of $R^1$, $R^2$, $R^3$ and $R^4$ is independently selected from C1 to C8 aliphatic, C4 to C8 heteroaromatic and C6 to C8 aromatic substituents, wherein said heteroaromatic and aromatic substituents may be further substituted.

According to an embodiment, any one of $R^1$, $R^2$, $R^3$ and $R^4$ is independently selected from C1 to C6 organic substituents comprising, from 0 to 3 N, S and/or O heteroatom, wherein, independently of said N, S or O heteroatoms, any one, several or all hydrogens in said substituent may be replaced by halogen, and wherein two or more of substituents present on the same cation may be covalently connected to each other to form a substituted or unsubstituted ring or ring system. Preferably, any one of $R^1$, $R^2$, $R^3$ and $R^4$ is independently selected from C1 to C6 aliphatic, C4 to C6 heteroaromatic and C6 to C6 aromatic substituents, wherein said heteroaromatic and aromatic substituents may be further substituted.

According to an embodiment, any one of $R^1$, $R^2$, $R^3$ and $R^4$ is independently selected from C1 to C4, preferably C1 to C3 and most preferably C1 to C2 aliphatic substituents wherein any one, several or all hydrogens in said substituent may be replaced by halogen and wherein two or more of substituents present on the same cation may be covalently connected to each other to form a substituted or unsubstituted ring or ring system.

According to an embodiment, any one of $R^1$, $R^2$, $R^3$ and $R^4$ is independently selected from C1 to C10 alkyl, C2 to C10 alkenyl, C2 to C10 alkynyl, C4 to C10 heteroaryl and C6 to C10 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C8 alkyl, C2 to C8 alkenyl, C2 to C8 alkynyl, C4 to C8 heteroaryl and C6 to C8 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C6 alkyl, C2 to C6 alkenyl, C2 to C6 alkynyl, C4 to C6 heteroaryl and C6 aryl, wherein said alkyl, alkenyl, and alkynyl, if they comprise 3 or more carbons, may be linear, branched or cyclic, wherein said heteroaryl and aryl may be substituted or unsubstituted, and wherein several or all hydrogens in $R^1$-$R^4$ may be replaced by halogen.

According to an embodiment, any one of $R^1$, $R^2$, $R^3$ and $R^4$ is independently selected from C1 to C4 alkyl, C2 to C4 alkenyl and C2 to C4 alkynyl, wherein said alkyl, alkenyl and alkynyl, if they comprise 3 or more carbons, may be linear, branched or cyclic, and wherein several or all hydrogens in in $R^1$-$R^4$ may be replaced by halogen.

According to an embodiment, any one of $R^1$, $R^2$, $R^3$ and $R^4$ is independently selected from C1 to C3, preferably C1 to C2 alkyl, C2 to C3, preferably C2 alkenyl and C2 to C3, preferably C2 alkynyl, wherein said alkyl, alkenyl and alkynyl, if they comprise 3 or more carbons, may be linear, branched or cyclic, and wherein several or all hydrogens in $R^1$-$R^4$ may be replaced by halogen.

According to an embodiment, any one of $R^1$, $R^2$, $R^3$ and $R^4$ is independently selected from C1 to C4, more preferably C1 to C3 and even more preferably C1 to C2 alkyl. Most preferably, any one of $R^1$, $R^2$, $R^3$ and $R^4$ are methyl. Again, said alkyl may be completely or partially halogenated.

According to an embodiment, A, A' and B are monovalent (A, A') and bivalent (B) cations, respectively, selected from substituted and unsubstituted C5 to C6 rings comprising one, two or more nitrogen heteroatoms, wherein one (for A and A') or two (for B) of said nitrogen atoms is/are positively charged. Substituents of such rings may be selected from halogen and from C1 to C4 alkyls, C2 to C4 alkenyls and C2 to C4 alkynyls as defined above, preferably from C1 to C3 alkyls, C3 alkenyls and C3 alkynyls as defined above. Said ring may comprise further heteroatoms, which may be selected from O, N and S. Bivalent organic cations B comprising two positively charged ring N-atoms are exemplified, for example, by the compound of formula (10) above. Such rings may be aromatic or aliphatic, for example.

A, A' and B may also comprise a ring system comprising two or more rings, at least one of which being from substituted and unsubstituted C5 to C6 ring as defined as above. The elliptically drawn circle in the compound of formulae (10) may also represent a ring system comprising, for example, two or more rings, but preferably two rings. Also if A and/or A' comprises two rings, further ring heteroatoms may be present, which are preferably not charged, for example.

According to an embodiment, however, the organic cations A, A' and B comprise one (for A, A'), two (for B) or more nitrogen atom(s) but are free of any O or S or any other heteroatom, with the exception of halogens, which may substitute one or more hydrogen atoms in cation A and/or B.

A and A' preferably comprise one positively charged nitrogen atom. B preferably comprises two positively charged nitrogen atoms.

A, A' and B may be selected from the exemplary rings or ring systems of formulae (30) and (31) (for A) and from (32) to (34) (for B) below:

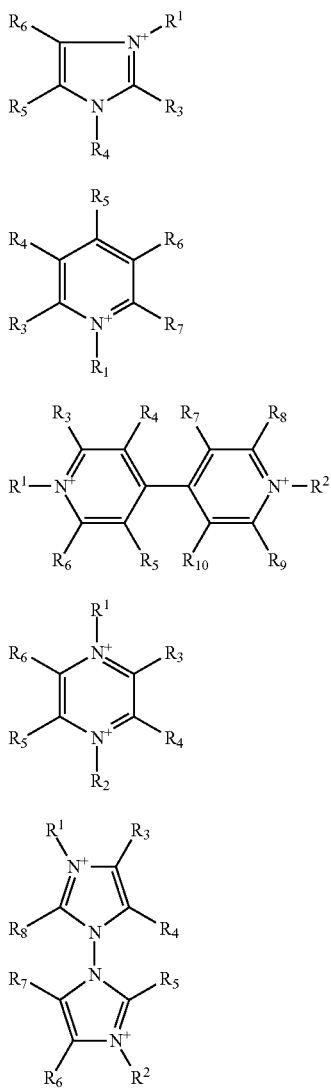

in which $R^1$ and $R^2$ are, independently, as defined above, and $R_3$, $R_4$, $R_5$, $R_6$, $R_7$, $R_8$, $R_9$ and $R_{10}$ are independently selected from H, halogen and substituents as defined above for $R^1$ to $R^4$. Preferably, $R_3$-$R_{10}$ are selected from H and halogen, most preferably H.

In the organic cations A, A' and B, hydrogens may be substituted by halogens, such as F, Cl, I, and Br, preferably F or Cl. Such a substitution is expected to reduce the hygroscopic properties of the perovskite layer or layers and may thus provide a useful option for the purpose of the present specification.

According to a preferred embodiment, A and A' are independently selected from organic cations of formula (1).

Preferably, $R^1$ in the cation of formula (1) is selected from C1 to C8 organic substituents comprising, from 0 to 4 N, S and/or O heteroatom. More preferably, $R^1$ is selected from C1 to C4, preferably C1 to C3 and most preferably C1 to C2 aliphatic substituents.

According to a preferred embodiment, the metal M is selected from $Sn^{2+}$ and $Pb^{2+}$, preferably $Pb^{2+}$. According to a preferred embodiment, N is $Sb^{3+}$.

According to a preferred embodiment, the three or four X are independently selected from $Cl^-$, $Br^-$, and $I^-$.

According to a preferred embodiment, the organic-inorganic perovskite material has the formula of formulae (XV) to (XIX) below:

wherein A and M are as defined elsewhere in this specification, including the preferred embodiments of A and M, such as those defined below. Preferably, M is selected from $Sn^{2+}$ and $Pb^{2-}$. Preferably, A is selected from organic cations of formula (1). Preferably, $R^1$ in the cation of formula (1) is selected from C1 to C8 organic substituents comprising, from 0 to 4 N, S and/or O heteroatom. More preferably, $R^1$ is selected from C1 to C4, preferably C1 to C3 and most preferably C1 to C2 aliphatic substituents.

According to a preferred embodiment, the organic-inorganic perovskite is a compound of formula (VII) ($AMX^iX^{ii}_{-i}X^{iii}$), wherein A is a monovalent cation of formula (1) as defined above, M is as defined elsewhere in this specification, and $X^i$, $X^{ii}$, $X^{iii}$ are independently selected from $Cl^-$, $Br^-$, $I^-$. Preferably, $R^1$ in the cation of formula (1) is selected from C1 to C4, preferably C1 to C3 and most preferably C1 to C2 aliphatic substituents.

According to a preferred embodiment, the organic-inorganic perovskite is a compound of formula (VII) ($AMX^iX^{ii}_{-i}X^{iii}$), wherein A is a monovalent cation of formula (1) as defined above, M is $Sn^{2+}$ or $Pb^{2-}$, and $X^i$, $X^{ii}$, $X^{iii}$ are independently selected from $Cl^-$, $Br^-$, $I^-$. Preferably, $R^1$ in the cation of formula (1) is selected from C1 to C4, preferably C1 to C3 and most preferably C1 to C2 aliphatic substituents. Preferably, $X^i$-$X^{iii}$ are identical.

In the methods of the invention, the perovskite layer 4 may be applied in any suitable way. According to a preferred embodiment, the sensitizer layer 4 is applied on and/or deposited on the metal oxide layer 3. Preferably, the sensitizer layer 4 is in direct contact with and/or on said metal oxide layer 3.

For example, the perovskite layer 4 may be applied by any one or more selected from drop casting, spin-coating, dip-coating, curtain coating and spray-coating. In accordance with the state of the art, the perovskite layer 4 may be applied by spin-coating a solution comprising two precursors in a common solvent, for example.

According to a preferred embodiment of the present invention, the perovskite applied in at least two steps, for example two sequential and/or separate steps. As two-steps deposition procedure for organic-inorganic perovskites has been mentioned in U.S. Pat. No. 5,871,597.

According to a preferred embodiment, the step of applying and/or depositing said sensitizer layer 4 comprises:

a) applying and/or depositing a film comprising and/or consisting essentially of one or more divalent or trivalent metal salts; and,
b) applying and/or depositing one or more organic ammonium salts, wherein steps a) and b) may be conducted in any order.

In the method of the invention, step a) is preferably conducted before step b), but the present invention also encompasses, in other embodiments, that step b) is conducted first and step a) thereafter.

According to a preferred embodiment, said film comprising and/or consisting essentially of one or more divalent or trivalent metal salts is applied and/or deposited on said metal oxide layer 3.

According to an embodiment, the step of applying and/or depositing said sensitizer layer 4 comprises:
a) applying and/or depositing a film comprising and/or consisting essentially of one or more divalent or trivalent metal salt;
b) exposing and or contacting the film obtained in step a) to a solution comprising one or more organic ammonium salts in a solvent.

Preferably, said film comprising and/or consisting essentially of one or more divalent or trivalent metal salts is applied directly onto said metal oxide layer 3. Preferably, the perovskite layer is in direct contact with said metal oxide layer 3.

According to an embodiment, said film of said one or more divalent or trivalent metal salts is applied and/or deposited by any one or more methods selected from: deposition from solution (for example, from a solution A), deposition from a dispersion (for example, from a colloidal dispersion), deposition by thermal evaporation or sputtering, electrodeposition, atomic-layer-deposition (ALD), and formation of said metal salt in-situ.

According to an embodiment, said film of said one or more divalent or trivalent metal salts is applied and/or deposited from a solution. For the purpose of clarity, the solution applied may be referred to as solution A. Preferably, said film of said one or more divalent or trivalent metal salts is applied and/or deposited from a solution by spin-coating a solution A of said metal salt. For example, spin coating is conducted at 3'000 rpm or more, preferably 4'000 rpm or more.

According to an embodiment, said film of said one or more divalent or trivalent metal salts respectively, have the formula $MX_2$ and $NX_3$, respectively, wherein M, N and X are independently as defined above or elsewhere in this specification. Preferably, M is selected from $Sn^{2-}$ and $Pb^{2+}$. Preferably, X is a halide selected from $Cl^-$, $Br^-$, and $I^-$.

According to an embodiment, in said step a), two or more different divalent or trivalent metal salts are deposited. When more than one metal salts are applied and/or deposited (for example two or more divalent metal salts), the two different salts may be applied at the same time. According to an embodiment, the method of the invention comprises the steps of applying and/or depositing a film comprising two or more selected from $MX^i_2$ $MX^{ii}_2$ and $MX^{iii}_2$, wherein $X^i$, $X^{ii}$ and $X^{iii}$ (charge not shown) are here each different anions selected from $I^-$, $Cl^-$, $Br^-$, $NCS^-$, $CN^-$, and $NCO^-$, preferably from $I^-$, $Cl^-$, and $Br^-$. For example, $X^i$, $X^{ii}$ and $X^{iii}$ are $I^-$, $Cl^-$, and $Br^-$. respectively. A mixed perovskite is obtained if the metal salt film comprising $MX^i_2$ and $MX^{ii}_2$, or $MX^i_2$, $MX^{ii}_2$ and $MX^{iii}_2$, for example, may be exposed to an organic ammonium salt in accordance with the invention, which may be selected, independently from any one of $AX^i$, $AX^{ii}$ and $AX^{iii}$.

Preferably, if the metal salt film comprises $MX^i_2$ and $MX^{ii}_2$, the organic ammonium salt is selected from salts comprising one of the anions contained in the metal salt layer, for example from $AX^i$ or $AX^{ii}$.

In an embodiment, applying said perovskite comprises the step b) of applying and/or depositing an organic ammonium salt. If step b) is conducted after step a), it preferably comprises or consists essentially of the step of exposing or contacting the film obtained in step a) to a solution comprising one or more organic ammonium salts in a solvent. The solution comprising one or more organic ammonium salts in a solvent is referred to as solution B, independently from whether or not a solution A is used for applying said divalent or trivalent metal salt, for example if said metal salt is not deposited from a solution (in which case there is no solution A).

The solvent for producing the solution B comprising said one or more organic ammonium salts is preferably selected from solvents that are good solvents for the organic ammonium salt to be dissolved but a bad solvent for the divalent or trivalent metal salt, in particular $MX_2$ or $NX_3$. The solvent is preferably also a bad solvent (does not dissolve) for the resulting perovskite.

The one or more divalent or trivalent metal salts may be exposed to or contacted with said solution B comprising the organic ammonium salt by dipping the crystals and/or metal salt into said solution. For example, the surface, layer and/or precursor device and/or partially assembled device comprising the deposited metal salt (e.g. $MX_2$ or $NX_3$) layer may be dipped into said solution B of the organic ammonium salt.

According to an embodiment, said metal salt film is exposed to or contacted with said solution B for 10 minutes or less, preferably 5 minutes or less, even more preferably 1 minute or less, or for the time periods given in the paragraph below.

According to an embodiment, said organic-inorganic perovskite is formed within <120 s, preferably <60 s following exposure to said solution. More preferably, said organic-inorganic perovskite is formed within <45 s, preferably <30 s following exposure to said solution B. In the case of dipping, the surface, layer and/or partially assembled device comprising the deposited metal salt layer may be dipped into said solution B for the time periods indicated above (<120 s, etc.). Exposure time (contacting, dipping) is preferably conducted for at least one second, more preferably at least two second.

In an embodiment, said solution comprising said one or more divalent or trivalent metals salts, preferably said solution A, further comprises salts of P and Y, wherein P is selected from inorganic and organic cations and Y is selected from $Cl^-$, $Br^-$ and $I^-$. If P is a divalent or trivalent cation, there is preferably a corresponding number of Y to compensate the cationic charge of P in said salt. This embodiment preferably concerns process step a) of the application of said perovskite layer.

In an embodiment, Y is the same as at least one X of said divalent or trivalent metal salt (for example $PY_2$, if the cation is a divalent inorganic or organic cation).

In an embodiment, P is selected from a monovalent, divalent or trivalent inorganic or organic cation, the organic cation being preferably selected from ammonium, imidazolium, pytidimium and phosphonium compounds, including the cations of formula A and B defined elsewhere in this specification.

According to an embodiment, if P is an inorganic cation, it is selected from monovalent, bivalent or trivalent inorganic cations. According to a preferred embodiment, P is a monovalent inorganic cation. Most preferably, P is selected from $Li^+$, $Na^+$, $K^+$ and $Cs^+$.

In an embodiment, P is selected from monovalent inorganic cations and from organic cations A as defined elsewhere in this specification. More preferably, P is selected from $Li^+$, $Na^+$, $K^+$ and $Cs^+$. Most preferably, P is $Li^+$.

Y is preferably an anion that is present in said perovskite. Accordingly, Y is preferably X, or if there are different X, for example $X^i$ and $X^{ii}$, where $X^i$ and $X^{ii}$ are different halides, Y is the same as one of said $X^i$ and $X^{ii}$.

Preferably, PY is PX. According to an embodiment, PY is LiX.

Preferably, said step of applying and/or depositing a film comprising one or more divalent or trivalent metal salts, preferably on said metal oxide layer 3, comprises: applying said film from a solution (preferably solution A) comprising said one or more divalent or trivalent metals salts, respectively, having the formula $MX_2$ and $NX_3$, wherein said solution further comprises PY, as defined above. PY, for example LiI, is preferably present at lower concentrations than said divalent or trivalent metal salt, for example at a concentration of ≤1.5 M, ≤1.0 M, ≤0.5 M, preferably ≤0.1 M, more preferably ≤0.05 M, most preferably in the range of 0.01 and 0.03M.

For comparison, said one or more divalent or trivalent metal salts, for example $MX_2$ and $NX_3$, are present at concentrations of about 0.4 to 2 M, preferably 0.5 to 1.5 M, more preferably 0.8-1.2 M.

Surprisingly, the presence of a salt PY, such as LiX enhances the conversion of the divalent or trivalent metal salt to the perovskite. In particular, the presence of residual metal salt is avoided and the conversion is complete within the relatively short time periods of immersion in solution B specified elsewhere.

Concerning the solar cells of the invention and the methods of producing them, said solar cell preferably comprises an intermediate layer 7 selected from (a) a hole transport material, (b) a protective layer and (c) an ionic liquid, said intermediate layer being applied after obtaining said sensitizer layer 4, in particular said perovskite layer. The intermediate layer is preferably applied after and/or onto the sensitizer layer 4.

By "hole transport material", "hole transporting material", "charge transporting material", "organic hole transport material" and "inorganic hole transport material", and the like, is meant any material or composition wherein charges are transported by electron or hole movement (electronic motion) across said material or composition. The "hole transport material" is thus an electrically conductive material. Such hole transport materials, etc., are different from electrolytes. In the latter, charges are transported by diffusion of molecules.

According to a preferred embodiment of the solar cell of the invention, said intermediate layer comprises a hole transport material selected from organic and inorganic hole transport materials. According to a preferred embodiment, said intermediate layer comprises an organic hole transport material. Preferably, the solar cell of the invention comprises an intermediate layer, in particular an organic hole transport material, situated between said one or more sensitizer layer 4 (e.g. perovskite layer) and a counter electrode.

The skilled person is aware of a large variety of organic hole transport materials, such as the conducting polymers disclosed elsewhere in this specification. For example, in WO2007107961, a liquid and non-liquid organic hole conductor are disclosed, which may be used for the purpose of the present invention. Also in EP 1160888 and other publications organic hole transport materials ("organic electrically conducting agent") are disclosed.

Preferred organic hole transport materials for the purpose of the present invention are are Spiro-OMeTAD (2,2',7,7'-tetrakis-N,N-di-p-methoxyphenylamine-9,9'-spirobifluorene) and derivatives of PTAA (poly(triarlyamine)) such as (Poly[bis(4-phenyl)(2,4,6-trimethylphenyl)amine]) or (Poly[bis(4-phenyl)(4-butylphenyl)amine]). US 2012/0017995, disclosing further hole transport materials, is entirely incorporated herein by reference.

It is noted that the term "organic" in expressions "organic hole transport material", "organic hole transport layer", "organic charge transport material" "electron blocking layer" and the like does not exclude the presence of further components. Further components may be selected from (a) one or more dopants, (b) one or more solvents, (c) one or more other additives such as ionic compounds, and (c) combinations of the aforementioned components, for example. In the organic charge transport material, such further components may be present in amounts of 0-30 wt. %, 0-20 wt. %, 0-10 wt. %, most preferably 0-5 wt. %.

Examples of ionic compounds that may be present in organic hole transport materials are $TBAPF_6$, Na $CF_3SO_3$, Li $CF_3SO_3$, $LiClO_4$ and $Li[(CF_3SO_2)_2N]$.

Examples of other compounds that may be present in organic hole transport materials are amines, 4-tertbutylpyridine, 4-nonyl-pyridine, imidazole, N-methyl benzimidazole, for example.

According to another embodiment, the intermediate layer comprises and/or consists essentially of an inorganic hole transport material. A wide variety of inorganic hole transport materials is commercially available. Non-limiting examples of inorganic hole transport materials are Cu2O, CuNCS, CuI, $MoO_3$, and $WoO_3$. The inorganic hole transport material may or may not be doped.

According to an embodiment, the intermediate layer, for example said organic or inorganic hole transport material, removes holes from the sensitizer layer 4 and/or provides new electrons from the counter electrode to the sensitizer. In other terms, the hole transport material transports electrons from the counter electrode to the perovskite material layer.

The intermediate layer may comprise and/or consist essentially of a protective layer. According to an embodiment, the protective layer preferably comprises a metal oxide. In particular, the protective layer may comprise or consist essentially of a material selected from Mg-oxide, Hf-oxide, Ga-oxide, In-oxide, Nb-oxide, Ti-oxide, Ta-oxide, Y-oxide and Zr-oxide. Ga-oxide is a preferred material for said protective layer. If present, the protective layer preferably has a thickness of not more than 5 nm, preferably 4 nm or less, even more preferably 3 nm or less, and most preferably 2 nm or less. According to preferred embodiments, the protective layer has a thickness of 1.5 nm or less, and even 1 nm or less. Said metal "protective layer" is preferably a "buffer layer".

According to an embodiment, of the solar cell and/or heterojunction of the invention said protective layer is provided by atomic layer deposition (ALD). For example, 2 to 7 layers are deposited by ALD so as to provide said protective layer. Accordingly, said protective layer is preferably a metal oxide multilayer.

According to an embodiment, the protective layer is as disclosed in the pending international application PCT/IB2011/055550, filed on Dec. 8, 2011, which is entirely incorporated herein by reference.

According to another embodiment, the intermediate layer 7 is absent and said counter electrode and/or metal layer 5 is in direct contact with said sensitizer layer 4 and/or not separated by any further layer or medium from said sensitizer layer, as illustrated, for example, by the embodiment shown in FIGS. 4a-b. A hole transport layer may be absent, for example, if the sensitizer is a nanocomposite, in particular an organic inorganic perovskite. This has been disclosed in previously filed application EP 12179323.6.

If the sensitizer 4 does not comprise a nanocomposite, in particular if the sensitizer does not comprise or consist essentially of an organic inorganic perovskite, the intermediate layer 7 is preferably present, in particular in the form of a hole transport layer, such as an organic hole transport layer.

The counter electrode 5 faces the sensitizer layer 4 or, if present, the intermediate layer 7 towards the inside of the cell. The counter electrode 5 may form the outmost layer and thus one of the outer surfaces of the cell. It is also possible that a substrate or support layer is present on one side of counter electrode (FIG. 4d).

The counter electrode 5 generally comprises a catalytically active material, suitable to provide electrons and/or fill holes towards the inside of the device. The counter electrode may, for example, comprise one or more materials selected from (the group consisting of) Pt, Au, Ni, Cu, Ag, In, Ru, Pd, Rh, Ir, Os, C, conductive polymer, conductive oxide such as indium doped tin oxide (ITO), fluorine doped tin oxide (FTO), $ZnO-Ga_2O_3$, $ZnO-Al_2O_3$, tin-oxide, antimony doped tin oxide (ATO), $SrGeO_3$, and a combination of two or more of the aforementioned, for example. Conductive polymers may be selected from polymers comprising polyaniline, polypyrrole, polythiophene, polybenzene, polyethylenedioxythiophene, polypropylenedioxy-thiophene, polyacetylene, and combinations of two or more of the aforementioned, for example. Such conductive polymers may be used as hole transport materials. In an embodiment, the counter electrode is preferably a cathode.

The counter electrode 5 may be applied as is conventional, for example by thermal evaporation of the counter electrode material onto the perovskite layer or onto the intermediate layer, if present.

The counter electrode 5 is preferably connected to a current collector, which is then connected to the external circuit. As detailed with respect to the first side of the device, a conductive support such as conductive glass or plastic may be electrically connected to the counter electrode on the second side.

The solar cell of the invention is preferably a solid state solar cell.

The solar cell of the invention may be a dye-sensitized solar cell (DSC), for example sensitized by a nanocomposite sensitizer, such as said organic-inorganic perovskite.

According to an embodiment, solar cell according to an embodiment of the invention exhibits a power conversion efficiency (PCE) of ≥4%, preferably ≥5%, more preferably ≥6%, and most preferably ≥7%, measured in standard air mass 1.5 global (AM1.5G) sunlight conditions, corresponding to a solar zenith angle of 48.2°, a solar light intensity of 100 mW cm$^2$ and a cell temperature of 25° C.

The photoanode and/or working electrode of the solar cell of the invention may be formed by the metal oxide layer 3, optionally together with the sensitizer layer 4. According to an embodiment, the photoanode and/or working electrode is formed by the organic-inorganic perovskite layer 4. This applies, for example, if the metal oxide layer 3 functions merely as a blocking layer.

The present invention will now be illustrated by way of examples. These examples do not limit the scope of this invention, which is defined by the appended claims.

EXAMPLES

Example 1: Low-Temperature Preparation of a Thin Film, Solid State Solar Cell

The $TiO_2$ nanolayers (NL-$TiO_2$) are made via the chemical bath deposition of aqueous $TiCl_4$ (40 mM, 75° C., 30 min) on the FTO substrates followed by a rinsing in water and ethanol.

The process is repeated multiple times to ensure better coverage on the FTO surface. Exposing the FTO either to the absorber or hole conductor can lead to an unwanted back flow of electrons which results in the loss of photogenerated charge carriers.

Using different concentrations of $TiCl_4$ leads to obtain metal oxide layers of various thicknesses as shown in Table 1. Thicknesses between 5 and 200 nm of the $TiO_2$ layer seem to perform better than thicknesses being above 200 nm.

TABLE 1

Thickness of the metal oxide layer and the efficiency of solid state solar cell impact

| $TiCl_4$ (mM) | Thickness of $TiO_2$ layer (nm) | Intensity (%) | Voc (mV) | Jsc (mA/cm$^2$) | FF | η (%) |
|---|---|---|---|---|---|---|
| 100 mM $TiCl_4$ | 5 | 99.1 | 916 | 16.48 | 0.685 | 10.5 |
| 200 mM $TiCl_4$ | 20-40 | 97.4 | 1110 | 17.41 | 0.656 | 13.03 |
| 250 mM $TiCl_4$ | 240-300 | 98.5 | 996 | 15.24 | 0.586 | 9.10 |
| 300 mM $TiCl_4$ | ~1000 | 98.5 | 773 | 13.19 | 0.605 | 6.26 |
| 400 mM $TiCl_4$ | 5000-10000 | 100.5 | 749 | 11.61 | 0.492 | 4.21 |

On the NL-TiO2, a solid thin-film of the perovskite absorber (~300-400 nm) is deposited on top of the NL-TiO2 using a sequential deposition technique in an H2O free dry box reported in EP13166720.6, filed on May 14, 2013. The procedure is briefly elaborated below.

The mixture of $PbI_2$ (1M) and LiI (0.025M) in DMF is spin-coated (6500 rpm, 30 s) on the NL-$TiO_2$ and dried at 70° C. for 15 min. The $PbI_2$ films were then converted to the perovskite $CH_3NH_3PbI_3$ absorber by dipping the films for 30 s into a solution of methyl ammonium iodide (8 mg/ml in isopropanol) and dried at 70° C. for 30 min. The addition of the LiI enhances the conversion of $PbI_2$ to $CH_3NH_3PbI_3$ as evidenced from the X-ray diffractogram presented in the next section.

The device assembly is completed by depositing the hole transport layer (Spiro-OMeTAD) on to the perovskite film and followed by the evaporation of gold as a back contact. The photovoltaic characteristics are investigated in the corresponding device under standard AM1.5G solar illumination. FIG. 1b shows the current density-voltage curves. The device exhibits open-circuit potential ($V_{OC}$), short-circuit current density ($J_{SC}$) and fill factor (ff), respectively of 922 mV, 11.5 mA/cm$^2$ and 0.68 resulting in a power conversion efficiency (PCE) of 7.3%.

Figure 2:
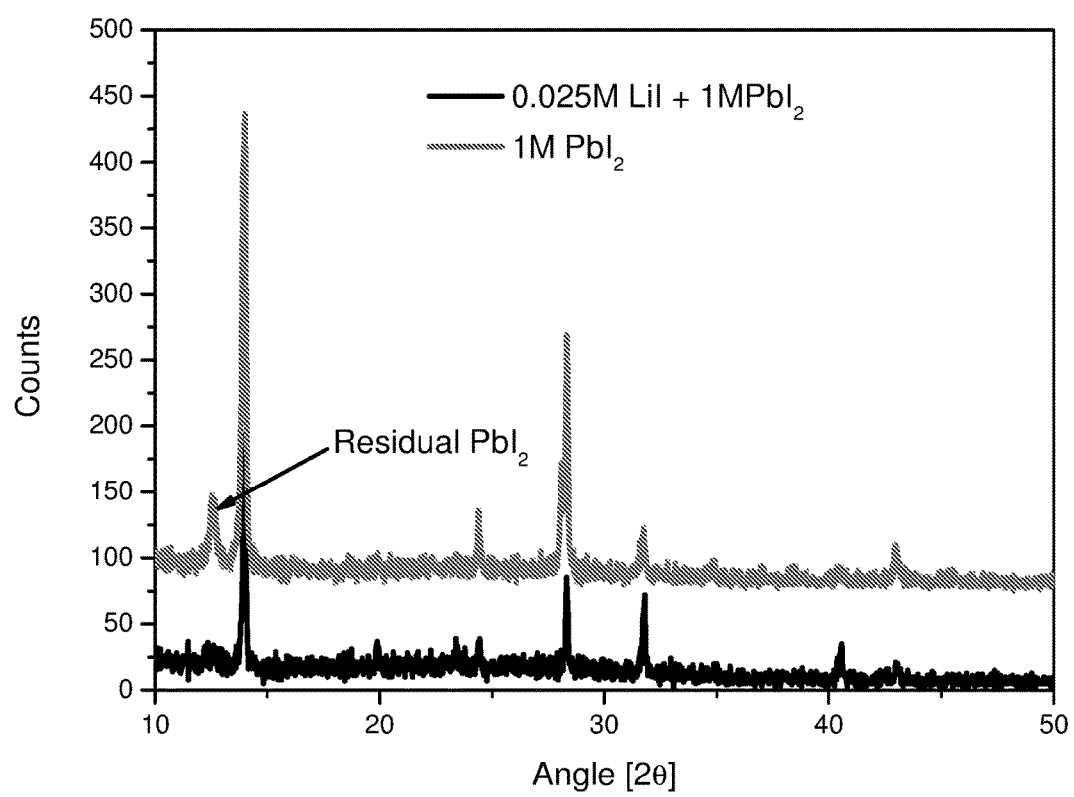
FIG. 2 shows X-Ray diffractograms of the sensitizer layer obtained in different ways, in accordance with different embodiments of the process of the invention. The diffractogram shown on top (red) is a sensitizer in which 1M PbI$_2$ solution was deposited in the first step. On the bottom (black), he perovskite is obtained by depositing a mixture of 1M PbI$_2$ and 0.025M LiI. In the top diffractogram the presence of residual PbI$_2$ can be seen.

Example 2: Influence of Additional or Different Metal Halide Precursor on the Crystal Growth of Perovskite Sensitizer FIG. 2 shows the X-Ray diffractogram (BRUKER D8 DISCOVER) of the absorber material on microscopic glass substrates with and without the addition of LiI. Both the samples exhibit similar Bragg reflections confirming the formation of the perovskite crystals. In addition the sample without LiI displayed a peak at ~11° and it is attributed to the presence of residual $PbI_2$. It can be concluded that the addition of the LiI enhances the conversion of $PbI_2$ to $CH_3NH_3PbI_3$ and it also increases the solubility of the 1M $PbI_2$ in DMF solution at room temperature. Since the LiI is soluble in isopropanol, neither the residual LiI nor the residual $PbI_2$ is observed in the XRD after the conversion to the perovskite.

Figure 3:
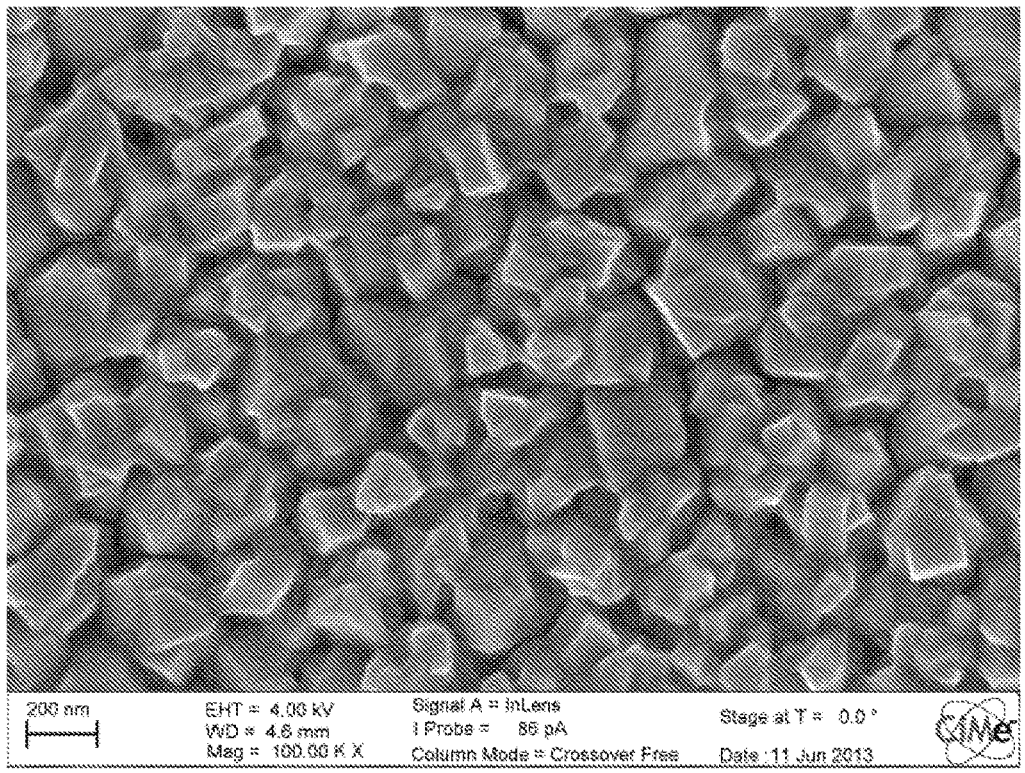
FIGS. 3a and b are SEM images showing the top view of the CH$_3$NH$_3$PbI$_3$ film obtained by spin coating using 1M PbI$_2$ solution (3a) and the IMPbI$_2$+0.025M LiI solution (3b), in accordance with process steps of some embodiments of the invention.
Figure 3:
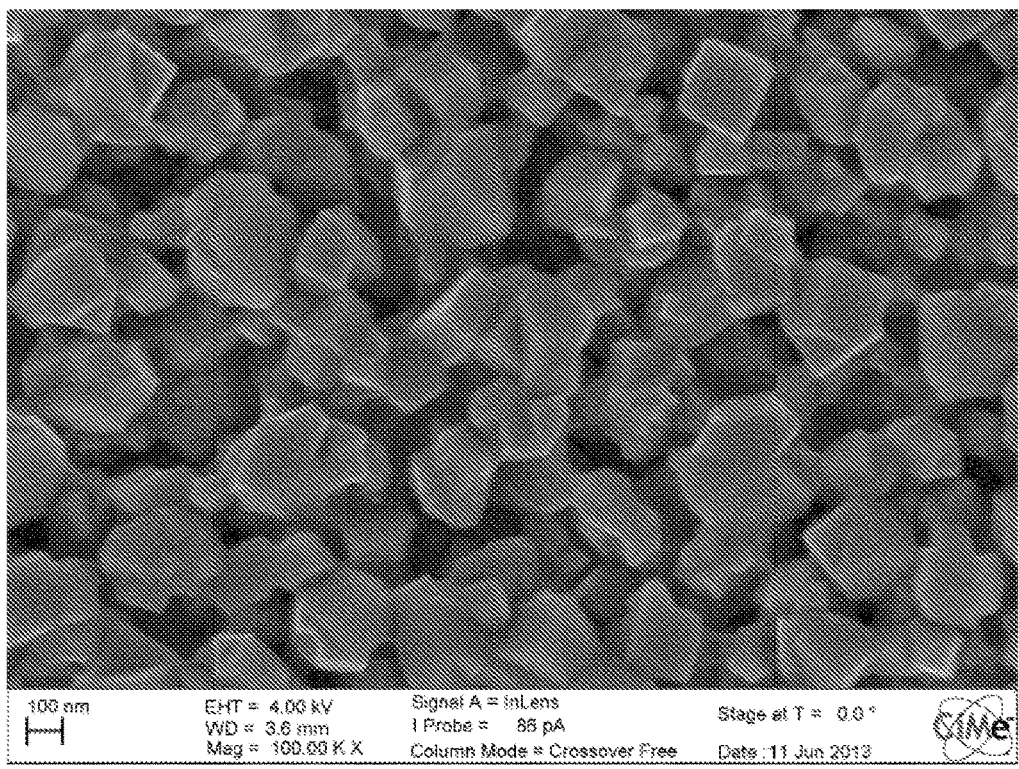

FIGS. 3a and b are SEM images showing the top view of the $CH_3NH_3PbI_3$ film obtained by spin coating the $PbI_2$ solution in DMF with (FIG. 3b) and without LiI (FIG. 3a). In the case of the pure $PbI_2$ films, the nucleation of the methyl ammonium lead iodide happens on the top of the flat $PbI_2$ not allowing the diffusion of the methyl ammonium iodide for the complete conversion of the $PbI_2$ into $CH_3NH_3PbI_3$. With the addition of the LiI, the complete conversion of the $PbI_2$ on a flat film can be achieved in 30 s resulting in the formation of $CH_3NH_3PbI_3$ perovskite.

The present invention addresses the long-standing issue of the requirement of thermal treatment of mesoporous metal oxides and provides low-temperature processable mesoporous oxides. The inventors effectively deposited an ultrathin layer of $TiO_2$ nanoparticular compact film (10-20 nm) on a transparent conducting glass from a $TiCl_4$ chemical bath at 75° C. The as-deposited films are used as photoanodes as-such without subsequent thermal sintering steps, thus completely eliminating the need for a compact layer on the TCO plus a mesoporous $TiO_2$ scaffold used in any conventional DSC.

Additionally, one has to note that the significant time saving achieved with our recent method of fabricating solar cells. For the preparation of conventional $TiO_2$ paste, a bare-minimum of one week is required. In the present case, the whole photoanode preparation takes 2 to 3 hours which further highlights the economical aspect of our new device architecture. FIG. 1a shows the cross-sectional view of the solid-state low temperature processed solar cell.

In conclusion, we present new device architecture for the low temperature fabrication of next generation solar cells that can be effectively utilized on any arbitrary flexible conducting substrates.

The invention claimed is:

1. A method for producing a solid state solar cell, the method comprising the steps of:
   providing a layer comprising a current collector;
   applying a metal oxide layer, wherein said metal oxide layer has a thickness of 200 nm or less and has a surface area per gram ratio of ≤60 $m^2/g$;
   applying a sensitizer layer; and
   applying a hole transporting layer;
   providing a counter electrode;
   wherein said metal oxide layer is applied on one selected from: (a) said current collector; (b) an optional compact metal oxide underlayer; and (c) on an optional nanoporous scaffold layer, characterized in that during and following the step of applying said metal oxide layer up to the step of applying the sensitizer layer, the temperature is kept at less than and/or not exceeding 200° C.; and
   wherein said sensitizer layer comprises an organic-inorganic perovskite and said step of applying a sensitizer layer comprises the steps of:
       applying and/or depositing a film comprising one or more divalent or trivalent metal salts; and
       exposing and/or contacting the film obtained in the previous step to a solution comprising one or more organic ammonium salts in a solvent, thereby obtaining a layer comprising an organic-inorganic perovskite.

2. The method of claim 1, wherein during said method, the solar cell or a partially assembled solar cell comprising at least said current collector and said metal oxide layer is consistently and continuously exposed to temperatures of less than 300° C.

3. A method for producing a solid state solar cell, the method comprising the steps of:
   providing a layer comprising a current collector;
   applying a metal oxide layer, wherein said metal oxide layer has a thickness of 200 nm or less and has a surface area per gram ratio of ≤60 $m^2/g$;
   applying a sensitizer layer comprising an organic-inorganic perovskite; and
   applying a hole transporting layer;
   providing a counter electrode;
   wherein said metal oxide layer is applied on one selected from: (a) said current collector; (b) an optional compact metal oxide underlayer; and (c) on an optional nanoporous scaffold layer, characterized in that during and following the step of applying said metal oxide layer up to the step of applying the sensitizer layer, the temperature is kept at less than 300° C.;
   wherein said sensitizer layer comprises an organic-inorganic perovskite and said step of applying a sensitizer layer comprises the steps of:
       applying and/or depositing a film comprising one or more divalent or trivalent metal salts; and
       exposing and/or contacting the film obtained in the previous step to a solution comprising one or more organic ammonium salts in a solvent, thereby obtaining a layer comprising an organic-inorganic perovskite; and
   wherein said metal oxide layer is not exposed to temperatures exceeding 300° C. and/or wherein said metal oxide layer is not sintered.

4. The method of claim 1, wherein said metal oxide layer is deposited directly on said current collector and or on a compact metal oxide underlayer.

5. The method of claim 1, wherein said layer comprising a current collector is a conductive support layer, preferably selected from a conductive glass and a conductive plastic.

6. The method of claim 1, wherein said metal oxide layer is applied by chemical bath deposition (CBD).

7. The method of claim 1, wherein said metal oxide layer is applied by exposing one selected from: (a) said current collector; (b) said optional compact metal oxide underlayer; and (c) said optional nanoporous scaffold layer, as applicable, with a solution comprising $TiCl_4$.

8. A method for producing a solid state solar cell, the method comprising the steps of:
   providing a layer comprising a current collector;
   applying a metal oxide layer, wherein said metal oxide layer has a thickness of 200 nm or less and has a surface area per gram ratio of ≤60 $m^2/g$;
   applying a sensitizer layer comprising an organic-inorganic perovskite; and
   applying a hole transporting layer;
   providing a counter electrode;
   wherein said metal oxide layer is applied on one selected from: (a) said current collector; (b) an optional compact metal oxide underlayer; and (c) on an optional nanoporous scaffold layer, characterized in that during and following the step of applying said metal oxide layer up to the step of applying the sensitizer layer, the temperatures is kept at less than 300° C.;

wherein said sensitizer layer comprises an organic-inorganic perovskite and said step of applying a sensitizer layer comprises the steps of:

applying and/or depositing a film comprising one or more divalent or trivalent metal salts; and exposing and/or contacting the film obtained in the previous step to a solution comprising one or more organic ammonium salts in a solvent, thereby obtaining a layer comprising an organic-inorganic perovskite;

wherein said one or more divalent or trivalent metals salts, respectively, have the formula $MX_2$ and $NX_3$; and wherein M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$;

N is selected from the group of $Bi^{3+}$ and $Sb^{3+}$; and any X is independently selected from $Cl^-$, $Br^-$, $I^-$, $NCS^-$, $CN^-$, and $NCO^-$;

wherein said organic ammonium salt is selected from AX, $AA'X_2$, and $BX_2$, A and A' being independently selected from organic, monovalent cations selected from primary, secondary, tertiary or quaternary organic ammonium compounds, including N-containing heterorings and ring systems, A and A' having from 1 to 60 carbons and 1 to 20 heteroatoms; and B being an organic, bivalent cation selected from primary, secondary, tertiary or quaternary organic ammonium compounds having from 1 to 60 carbons and 2 to 20 heteroatoms and having two positively charged nitrogen atoms.

9. The method of claim 1, wherein said step of applying and/or depositing a film comprising one or more divalent or trivalent metal salts on said metal oxide layer comprises applying said film from a solution comprising said one or more monovalent, divalent or trivalent metals salts, wherein said solution further comprises a salt of P and Y, wherein P is selected from inorganic and organic cations and Y is selected from $Cl^-$, $Br^-$ and $I^-$, wherein, if P is a divalent or trivalent cation, there is a corresponding number of Y to compensate the cationic charge of P in said salt.

10. A solid state solar cell produced by the method of claim 1, wherein the sensitizer layer is in contact with said metal oxide layer; and wherein the hole transport layer is between said sensitizer layer and said counter electrode.

11. The solar cell of claim 10, wherein said metal oxide layer is in contact with said current collector.

12. The method of claim 1, wherein said temperature is less than and/or not exceeding 150° C.

13. The method of claim 12, wherein said temperature is less than and/or not exceeding 130° C.

14. The method of claim 13, wherein said temperature is less than and/or not exceeding 100° C.

* * * * *

UNITED STATES PATENT AND TRADEMARK OFFICE
CERTIFICATE OF CORRECTION

PATENT NO. : 10,332,689 B2
APPLICATION NO. : 14/966551
DATED : June 25, 2019
INVENTOR(S) : Yella Aswani et al.

Page 1 of 1

It is certified that error appears in the above-identified patent and that said Letters Patent is hereby corrected as shown below:

In the Specification

Column 2
- Line 11: "...multi junction" to be replaced with "multi-junction"

Column 20
- Line 27: "$Sn^{2+}$ and $Pb^{2-}$" to be replaced with "$Sn^{2+}$ and $Pb^{2+}$"
- Lines 34-35: "$AMX^{i}X^{i}\text{-}iX^{iii}$" to be replaced with "$AMX^{i}X^{ii}X^{iii}$"
- Lines 42-43: "$AMX^{i}X^{i}\text{-}iX^{iii}$" to be replaced with "$AMX^{i}X^{ii}X^{iii}$"

Column 21
- Line 49: "$Sn^{2-}$ and $Pb^{2+}$" to be replaced with "$Sn^{2+}$ and $Pb^{2+}$"

Signed and Sealed this
Twentieth Day of August, 2019

Andrei Iancu
*Director of the United States Patent and Trademark Office*